(12) United States Patent
Jang et al.

(10) Patent No.: US 12,224,780 B2
(45) Date of Patent: Feb. 11, 2025

(54) ELECTRONIC DEVICE INCLUDING POWER AMPLIFIER AND FRONT-END MODULE INCLUDING POWER AMPLIFIER

(71) Applicant: SAMSUNG ELECTRONICS CO., LTD., Suwon-si (KR)

(72) Inventors: Kyujae Jang, Suwon-si (KR); Cheonshik Kim, Suwon-si (KR); Juho Van, Suwon-si (KR); Jonghyeok Im, Suwon-si (KR); Daeyoung Jo, Suwon-si (KR); Youngjune Hong, Suwon-si (KR); Daehan Choi, Suwon-si (KR); Hyeyong Go, Suwon-si (KR); Yeongseob Lim, Suwon-si (KR); Sungyoul Cho, Suwon-si (KR); Taekyoung Jin, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 350 days.

(21) Appl. No.: 17/742,838

(22) Filed: May 12, 2022

(65) Prior Publication Data

US 2022/0368358 A1 Nov. 17, 2022

Related U.S. Application Data

(63) Continuation of application No. PCT/KR2022/006270, filed on May 2, 2022.

(30) Foreign Application Priority Data

May 13, 2021 (KR) .................. 10-2021-0062270

(51) Int. Cl.
*H04B 1/04* (2006.01)
*H03F 3/24* (2006.01)

(52) U.S. Cl.
CPC ............... *H04B 1/04* (2013.01); *H03F 3/245* (2013.01); *H03F 2200/102* (2013.01);
(Continued)

(58) Field of Classification Search
CPC .... H03F 1/0211; H03F 1/0277; H03F 1/0283; H03F 2200/102; H03F 2200/105;
(Continued)

(56) References Cited

U.S. PATENT DOCUMENTS

2008/0012654 A1  1/2008  Han et al.
2011/0298435 A1* 12/2011  Homol ...................... H03F 1/34
                                                              323/282
(Continued)

FOREIGN PATENT DOCUMENTS

JP    2020-120368 A    8/2020
KR   10-2008-0006983   1/2008
(Continued)

OTHER PUBLICATIONS

PCT International Search Report dated Aug. 16, 2022 for PCT/KR2022/006270.
PCT Written Opinion dated Aug. 16, 2022 for PCT/KR2022/006270.

*Primary Examiner* — Tan H Trinh
(74) *Attorney, Agent, or Firm* — Nixon & Vanderhye P.C.

(57) ABSTRACT

According to various embodiments, an electronic device may include: a communication processor, a radio frequency (RF) integrated circuit (RFIC) configured to receive a signal output from the communication processor and to modulate the signal into an RF signal, a power management circuit, a first power amplifier configured to amplify an RF signal output from the RFIC based on power supplied from the power management circuit, a second power amplifier configured to amplify the RF signal output from the RFIC based on the power supplied from the power management circuit, (Continued)

at least one capacitor connected in parallel to a power supply terminal of the first power amplifier, and at least one switch connected between the power supply terminal and the at least one capacitor, wherein the communication processor is configured to: identify a power amplification mode based a frequency band of the RF signal, and control the at least one switch by outputting a control signal corresponding to the identified power amplification mode.

18 Claims, 24 Drawing Sheets

(52) U.S. Cl.
CPC .. *H03F 2200/105* (2013.01); *H03F 2200/171* (2013.01); *H03F 2200/451* (2013.01)

(58) Field of Classification Search
CPC ......... H03F 2200/171; H03F 2200/451; H03F 3/19; H03F 3/245; H03F 3/68; H04B 1/04
USPC ...................................... 455/127.1
See application file for complete search history.

(56) References Cited

U.S. PATENT DOCUMENTS

| | | | |
|---|---|---|---|
| 2012/0146731 A1* | 6/2012 | Khesbak | H03F 3/195 330/295 |
| 2016/0065139 A1 | 3/2016 | Lee et al. | |
| 2016/0094192 A1* | 3/2016 | Khesbak | H03F 1/223 330/252 |
| 2018/0034423 A1* | 2/2018 | Yanagihara | H03F 3/213 |
| 2019/0258309 A1* | 8/2019 | Grobelny | G06F 11/3055 |
| 2020/0136562 A1* | 4/2020 | Kim | H03F 3/245 |
| 2020/0169232 A1* | 5/2020 | Goto | H03F 3/245 |
| 2020/0259457 A1* | 8/2020 | Kim | H03F 3/189 |
| 2020/0412307 A1* | 12/2020 | Hitomi | H03F 1/0233 |
| 2021/0328558 A1* | 10/2021 | Goto | H03F 3/195 |
| 2022/0190793 A1* | 6/2022 | Chen | H03F 3/19 |
| 2022/0385314 A1* | 12/2022 | Kogure | H04B 1/04 |
| 2023/0072796 A1* | 3/2023 | Kogure | H03F 3/245 |

FOREIGN PATENT DOCUMENTS

| | | |
|---|---|---|
| KR | 10-2016-0028943 A | 3/2016 |
| KR | 10-2016-0036493 A | 4/2016 |
| KR | 10-1767858 B1 | 8/2017 |
| KR | 10-2020-0084693 A | 7/2020 |

* cited by examiner

ELECTRONIC DEVICE INCLUDING POWER AMPLIFIER AND FRONT-END MODULE INCLUDING POWER AMPLIFIER

CROSS-REFERENCE TO RELATED APPLICATIONS

This application is a continuation of International Application No. PCT/KR2022/006270 designating the United States, filed on May 2, 2022, in the Korean Intellectual Property Receiving Office and claiming priority to Korean Patent Application No. 10-2021-0062270, filed on May 13, 2021, in the Korean Intellectual Property Office, the disclosures of which are incorporated by reference herein in their entireties.

BACKGROUND

Field

The disclosure relates to an electronic device including a power amplifier and a front-end module including a power amplifier.

Description of Related Art

Various types of electronic devices that transmit or receive radio frequency (RF) signals may include at least one power amplifier (PA) to amplify RF signals.

According to various embodiments, the power amplifier may be implemented in various ways to increase efficiency. For example, the power amplifier may improve performance by applying an envelope tracking (ET) mode. Alternatively, the power amplifier may apply an average power tracking (APT) mode using a power management circuit.

For example, as a frequency band supported by an electronic device increases, a power amplification circuit for amplifying a radio frequency (RF) signal may include multiple power amplifiers. When the multiple power amplifiers are connected in parallel, each of the power amplifiers may operate in different modes according to a power supply scheme. For example, when a first power amplifier and a second power amplifier are connected in parallel, the first power amplifier may operate in an ET mode, and the second power amplifier may operate in an APT mode.

If power is concurrently supplied to multiple power amplifiers in a single power management circuit, since an optimal capacitance according to each mode is different, the multiple power amplifiers may not provide optimal performance according to a corresponding mode.

SUMMARY

Embodiments of the disclosure provide an electronic device and a front-end module, which include a power amplifier capable of adjusting capacitance according to an operation mode of each power amplifier if power is concurrently supplied to multiple power amplifiers in a single power management circuit.

Embodiments of the disclosure provide an electronic device and a front-end module, which include a power amplifier capable of adjusting capacitance according to an operation mode of the power amplifier, if one power amplifier supports multiple modes.

An electronic device according to various example embodiments may include: a communication processor, a radio frequency (RF) integrated circuit (RFIC) configured to receive a signal output from the communication processor and to modulate the signal into an RF signal, a power management circuit, a first power amplifier configured to amplify an RF signal output from the RFIC based on power supplied from the power management circuit, a second power amplifier configured to amplify the RF signal output from the RFIC based on the power supplied from the power management circuit, at least one capacitor connected in parallel to a power supply terminal of the first power amplifier, and at least one switch connected between the power supply terminal and the at least one capacitor, wherein the communication processor is configured to: identify a power amplification mode based a frequency band of the RF signal, and control the at least one switch by outputting a control signal corresponding to the identified power amplification mode.

An electronic device according to various example embodiments may include: a communication processor, a radio frequency (RF) integrated circuit (RFIC) configured to receive a signal output from the communication processor and to modulate the signal into an RF signal, a power management circuit, a first power amplifier configured to amplify an RF signal output from the RFIC based on power supplied from the power management circuit, a second power amplifier configured to amplify the RF signal output from the RFIC based on the power supplied from the power management circuit, and a variable capacitor connected in parallel to a power supply terminal of the first power amplifier, wherein the communication processor is configured to: identify a power amplification mode based on a frequency band of the RF signal, and adjust capacitance of the variable capacitor by outputting a control signal corresponding to the identified power amplification mode.

A front-end module according to various example embodiments may include: a power management circuit, a first power amplifier configured to amplify a radio frequency (RF) signal output from a radio frequency integrated circuit (RFIC) based on power supplied from the power management circuit, a second power amplifier configured to amplify the RF signal output from the RFIC based on the power supplied from the power management circuit, at least one capacitor connected in parallel to a power supply terminal of the first power amplifier, and at least one switch connected between the power supply terminal and the at least one capacitor, wherein the at least one switch is controlled by a control signal corresponding to a power amplification mode based on a frequency band of the RF signal.

In various example embodiments, if power is concurrently supplied to multiple power amplifiers in a single power management circuit, the optimal performance of a power amplifier for each operation mode can be provided by adjusting capacitance according to an operation mode of each power amplifier.

In various example embodiments, if one power amplifier supports multiple modes, the optimal performance of the power amplifier for each operation mode can be provided by adjusting capacitance according to an operation mode of the power amplifier, and component costs can be reduced due to not using multiple power management circuits.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
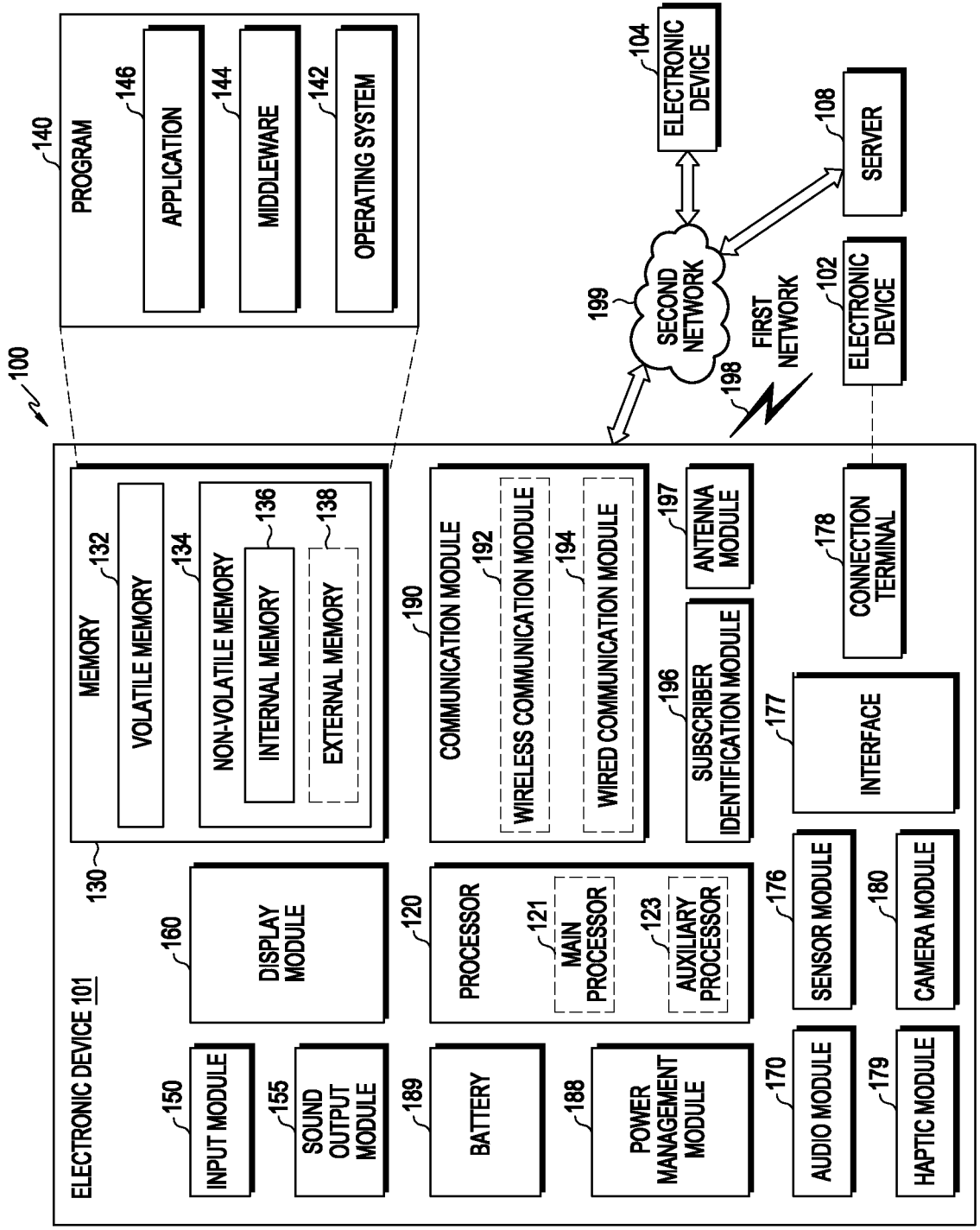
FIG. 1 is a block diagram illustrating an example electronic device in a network environment according to various embodiments.

FIG. 1 is a block diagram illustrating an example electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In various embodiments, at least one of the components (e.g., the connecting terminal 178) may be omitted from the electronic device 101, or one or more other components may be added in the electronic device 101. In various embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control, for example, at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active (e.g., executing an application) state. According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or an external electronic device (e.g., an electronic device 102 (e.g., a speaker or a headphone)) directly or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device 104 via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, an RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the external electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2A:
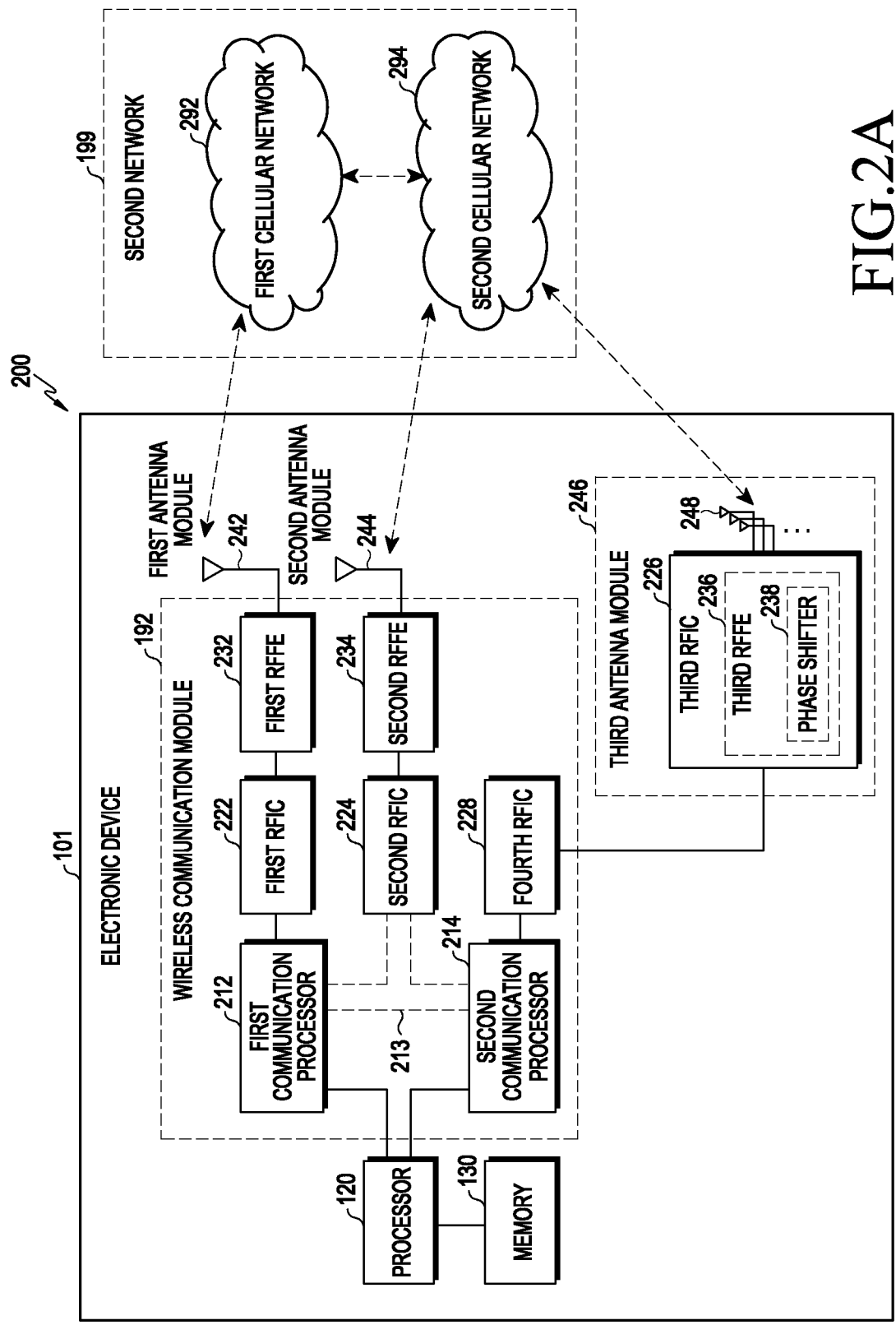
FIG. 2A is a block diagram illustrating an example configuration of the electronic device in a network environment including multiple cellular networks, according to various embodiments.

FIG. 2A is a block diagram 200 illustrating an example configuration of the electronic device 101 in a network environment including multiple cellular networks, according to various embodiments. Referring to FIG. 2A, the electronic device 101 may include a first communication processor (e.g., including processing circuitry) 212, a second communication processor (e.g., including processing circuitry) 214, a first radio frequency integrated circuit (RFIC) 222, a second RFIC 224, a third RFIC 226, a fourth RFIC 228, a first radio frequency front-end (RFFE) 232, a second RFFE 234, a first antenna module 242, a second antenna module 244, and antennas 248. The electronic device 101 may further include a processor 120 and a memory 130. The second network 199 may include a first cellular network 292 and a second cellular network 294. According to an embodiment, the electronic device 101 may further include at least one of the components illustrated in FIG. 1, and the second network 199 may further include at least one other network. According to an embodiment, the first communication processor 212, the second communication processor 214, the first RFIC 222, the second RFIC 224, the fourth RFIC 228, the first RFFE 232, and the second RFFE 234 may form at least a part of the wireless communication module 192. According to an embodiment, the fourth RFIC 228 may be omitted or may be included as a part of the third RFIC 226.

The first communication processor 212 may include various processing circuitry and support establishment of a communication channel of a band to be used for wireless communication with the first cellular network 292, and legacy network communication via the established communication channel According to various embodiments, the first cellular network may be a legacy network including a second generation (2G), 3G, 4G, or long-term evolution (LTE) network. The second communication processor 214 may include various processing circuitry and support establishment of a communication channel corresponding to a designated band (e.g., about 6 GHz to about 60 GHz) among bands to be used for wireless communication with the second cellular network 294, and 5G network communication via the established communication channel According to various embodiments, the second cellular network 294 may be a 5G network defined by 3GPP. In addition, according to an embodiment, the first communication processor 212 or the second communication processor 214 may support establishment of a communication channel corresponding to another designated band (e.g., about 6 GHz or lower) among the bands to be used for wireless communication with the second cellular network 294, and 5G network communication via the established communication channel According to an embodiment, the first communication processor 212 and the second communication processor 214 may be implemented in a single chip or a single package. According to various embodiments, the first communication processor 212 or the second communication processor 214 may be implemented, in a single chip or a single package, together with the processor 120, the auxiliary processor 123, or the communication module 190. According to an embodiment, the first communication processor 212 and the second communication processor 214 may be directly or indirectly connected to each other by an interface (not illustrated), so as to provide or receive data or a control signal in either or both directions.

Depending on implementation, the first communication processor 212 may not be directly connected to the second communication processor 214. In this case, the first communication processor 212 may transmit data to or receive data from the second communication processor 214 via the processor 120 (e.g., an application processor). For example, the first communication processor 212 and the second communication processor 214 may transmit or receive data via the processor 120 (e.g., an application processor) and an HS-UART interface or a PCIe interface, but the type of the interface is not limited. Alternatively, the first communication processor 212 and the second communication processor 214 may exchange control information and packet data information using the processor 120 (e.g., an application processor) and the shared memory.

Figure 2B:
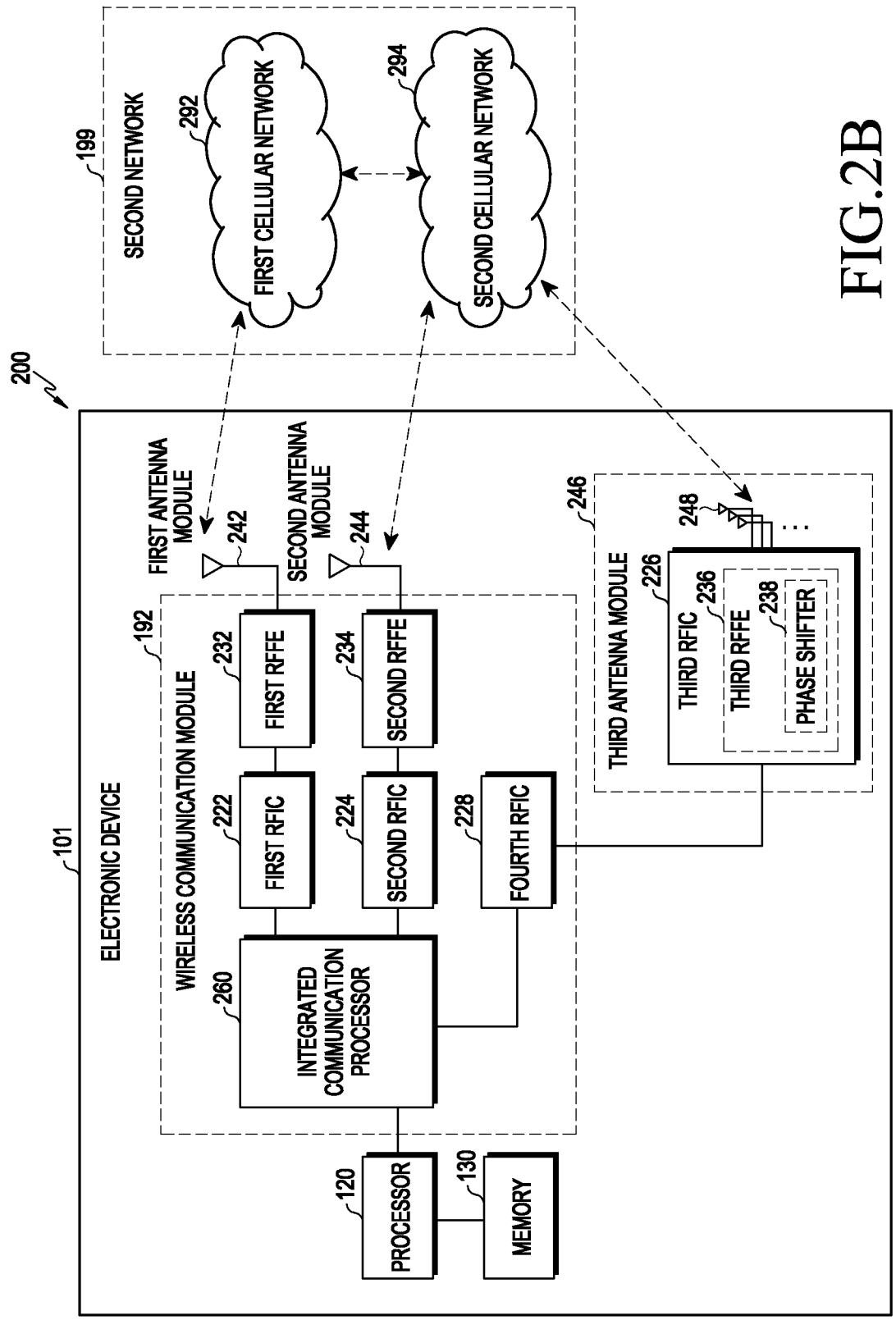
FIG. 2B is a block diagram illustrating an example configuration of the electronic device in a network environment including multiple cellular networks, according to various embodiments.

According to an embodiment, the first communication processor 212 and the second communication processor 214 may be implemented in a single chip or a single package. According to various embodiments, the first communication processor 212 or the second communication processor 214 may be implemented, in a single chip or a single package, together with the processor 120, an auxiliary processor 123, or the communication module 190. For example, as shown in FIG. 2B, an integrated communication processor 260 may include various processing circuitry and support both functions for communication with the first cellular network and the second cellular network.

The first RFIC 222 may convert, during transmission, a baseband signal generated by the first communication processor 212 into a radio frequency (RF) signal of about 700 MHz to about 3 GHz used for the first cellular network 292 (e.g., a legacy network). During reception, the RF signal may be acquired from the first cellular network 292 (e.g., a legacy network) via an antenna (e.g., the first antenna module 242) and may be preprocessed via RFFE (e.g., the first RFFE 232). The first RFIC 222 may convert the preprocessed RF signal into a baseband signal so as to be processed by the first communication processor 212.

The second RFIC 224 may convert, during transmission, a baseband signal generated by the first communication processor 212 or the second communication processor 214 into an RF signal (hereinafter, a 5G Sub6 RF signal) of a Sub6 band (e.g., about 6 GHz or lower) used for the second cellular network 294 (e.g., a 5G network). During reception, the 5G Sub6 RF signal may be acquired from the second cellular network 294 (e.g., a 5G network) via an antenna (e.g., the second antenna module 244) and may be preprocessed via RFFE (e.g., the second RFFE, 234). The second RFIC 224 may convert the preprocessed 5G Sub6 RF signal into a baseband signal so as to be processed by a communication processor corresponding to one of the first communication processor 212 or the second communication processor 214.

The third RFIC 226 may convert a baseband signal generated by the second communication processor 214 into an RF signal (hereinafter, a 5G Above6 RF signal) of a 5G Above6 band (e.g., about 6 GHz to about 60 GHz) to be used in the second cellular network 294 (e.g., a 5G network). During reception, the 5G Above6 RF signal may be acquired from the second cellular network 294 (e.g., a 5G network) via an antenna (e.g., the antenna 248) and may be preprocessed via the third RFFE 236. The third RFIC 226 may convert the preprocessed 5G Above6 RF signal into a baseband signal so as to be processed by the second communication processor 214. According to an embodiment, the third RFFE 236 may be formed as a part of the third RFIC 226.

According to an embodiment, the electronic device 101 may include the fourth RFIC 228 separately from or as at least a part of the third RFIC 226. In this case, the fourth RFIC 228 may convert a baseband signal generated by the second communication processor 214 into an RF signal (hereinafter, an IF signal) of an intermediate frequency band (e.g., about 9 GHz to about 11 GHz), and then may transfer the IF signal to the third RFIC 226. The third RFIC 226 may convert the IF signal into a 5G Above6 RF signal. During reception, the 5G Above6 RF signal may be received from the second cellular network 294 (e.g., a 5G network) via an antenna (e.g., the antenna 248) and may be converted to an IF signal by the third RFIC 226. The fourth RFIC 228 may convert the IF signal into a baseband signal so as to be processed by the second communication processor 214.

According to an embodiment, the first RFIC 222 and the second RFIC 224 may be implemented as at least a part of a single package or a single chip. According to an embodiment, the first RFFE 232 and the second RFFE 234 may be implemented as at least a part of a single package or a single chip. According to an embodiment, at least one of the first antenna module 242 or the second antenna module 244 may be omitted, or may be combined with another antenna module so as to process RF signals in multiple corresponding bands.

According to an embodiment, the third RFIC 226 and the antenna 248 may be disposed on the same substrate so as to form a third antenna module 246. For example, the wireless communication module 192 or the processor 120 may be disposed on a first substrate (e.g., a main PCB). In this case, the third RFIC 226 may be disposed in a partial area (e.g., bottom surface) of a second substrate (e.g., a sub-PCB) separate from the first substrate, and the antenna 248 may be disposed in another partial area (e.g., top surface), thereby forming the third antenna module 246. By placing the third RFIC 226 and the antenna 248 on the same substrate, it is possible to reduce the length of a transmission line therebetween. This, for example, may reduce the loss (e.g., attenuation), which is caused due to a transmission line, of a signal in a high frequency band (e.g., about 6 GHz to about 60 GHz) used for 5G network communication. Accordingly, the electronic device 101 may improve the quality or speed of communication with the second cellular network 294 (e.g., a 5G network).

According to an embodiment, the antenna 248 may be formed as an antenna array including multiple antenna elements that may be used for beamforming. In this case, the third RFIC 226 may include, for example, multiple phase shifters 238 corresponding to the multiple antenna elements, as parts of the third RFFE, 236. During transmission, each of the multiple phase shifters 238 may convert the phase of a 5G Above 6 RF signal to be transmitted to the outside of the electronic device 101 (e.g., a base station of a 5G network) via a corresponding antenna element. During reception, each of the multiple phase shifters 238 may convert the phase of the 5G Above6 RF signal received from the outside via the corresponding antenna element, into the same or substantially the same phase. This enables transmission or reception via beamforming between the electronic device 101 and the outside.

The second cellular network 294 (e.g., a 5G network) may be operated independently of (e.g., stand-alone (SA)) or in connection with (e.g., non-stand-alone (NSA)) the first cellular network 292 (e.g., a legacy network). For example, the 5G network may have only an access network (e.g., a 5G radio access network (RAN) or a next generation RAN (NG RAN)) and may not have a core network (e.g., a next generation core (NGC)). In this case, the electronic device 101 may access the access network of the 5G network, and then may access an external network (e.g., Internet) under the control of a core network (e.g., an evolved packed core (EPC)) of the legacy network. Protocol information (e.g., LTE protocol information) for communication with the legacy network or protocol information (e.g., new radio (NR) protocol information) for communication with the 5G network may be stored in the memory 230 and may be accessed by other components (e.g., the processor 120, the first communication processor 212, or the second communication processor 214).

Figure 3:
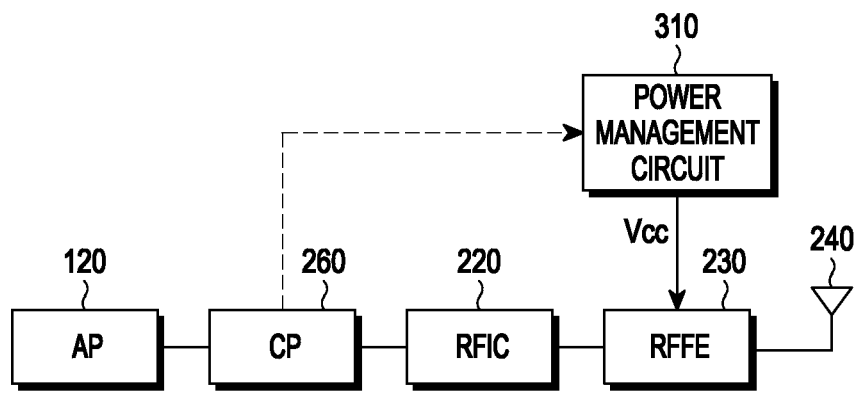
FIG. 3 is a block diagram illustrating an example configuration of the electronic device according to various embodiments.

FIG. 3 is a block diagram illustrating an example configuration of the electronic device according to various embodiments. Referring to FIG. 3, according to various embodiments, the electronic device 101 may include an application processor AP 120, a communication processor CP 260, an RFIC 220, an RFFE 230, an antenna 240, and a power management circuit 310 (e.g., the power management module 188 of FIG. 1). A baseband signal generated by the CP 260 may be transmitted to the RFIC 220. The RFIC 220 may modulate the baseband signal received from the CP 260 into a radio frequency (RF) signal. The RF signal modulated by the RFIC 220 may be input to the RFFE 230. The RFFE 230 may include, but is not limited to, a power amplifier (PA), a filter, or an antenna switching module (ASM).

According to various embodiments, the RFFE 230 may process an RF signal of each radio frequency band. The RFFE 230 of FIG. 3 may be implemented in various forms including at least one power amplifier. For example, the RFFE 230 may be configured in the form of a power amplifier module (PAM), a front-end module (FEM), a power amplifier module including a duplexer (PAMiD), an LNA and PAM with an integrated duplexer or diplexer (LPAMID), and a PA with an integrated low noise amplifier and filter (LPAMIF). FIG. 3 illustrates, for convenience of description, that at least one power amplifier is included in the RFFE 230, but various embodiments to be described in greater detail below are not limited thereto. The RF signal input to the RFFE 230 may be amplified into a signal of a desired size via at least one power amplifier and then may be transmitted to the antenna 240. The antenna 240 may transmit the signal received from the RFFE 230.

According to various embodiments, the RF signal received from the antenna 240 may be transmitted to the RFFE 230. The RFFE 230 may amplify the RF signal received from the antenna 240, via, for example, a low noise amplifier (LNA). The signal amplified by the RFFE 230 may be transmitted to the RFIC 220. The RFIC 220 may receive the signal amplified through the RFFE 230 and may demodulate the same into a baseband signal. The signal demodulated by the RFIC 220 may be transmitted to the CP 260.

According to various embodiments, the power management circuit 310 may supply the power Vcc (e.g., input power) to a power amplifier included in the RFFE 230. For example, the power management circuit 310 may supply the power Vcc corresponding to a power amplification mode of the power amplifier to a power supply terminal of the power amplifier, based on a control signal of the CP 260. According to various embodiments, the power amplification mode may include at least one of a battery direct mode, an average power tracking (APT) mode, and an envelope tracking (ET) mode.

Figure 5A:
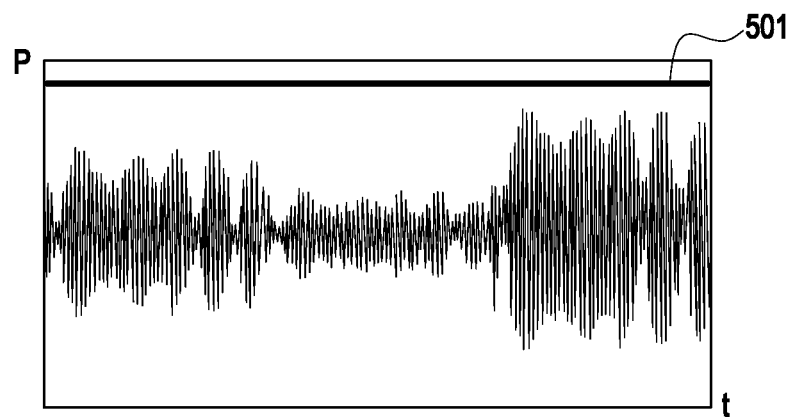
FIG. 5A, FIG. 5B, and FIG. 5C are graphs illustrating various operation modes of a power amplifier according to various embodiments.
Figure 5B:
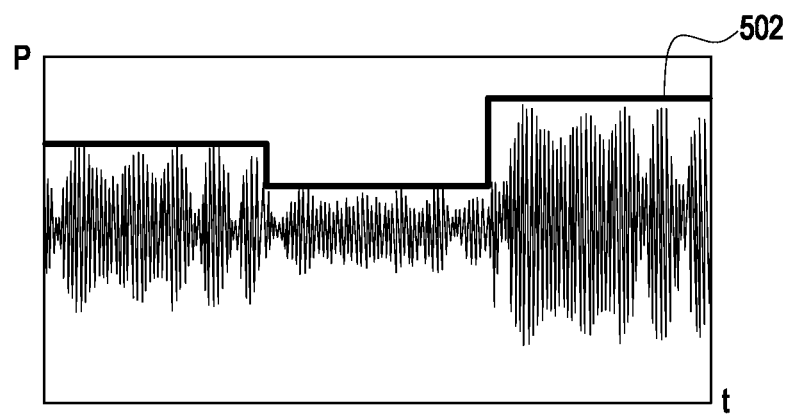
Figure 5C:
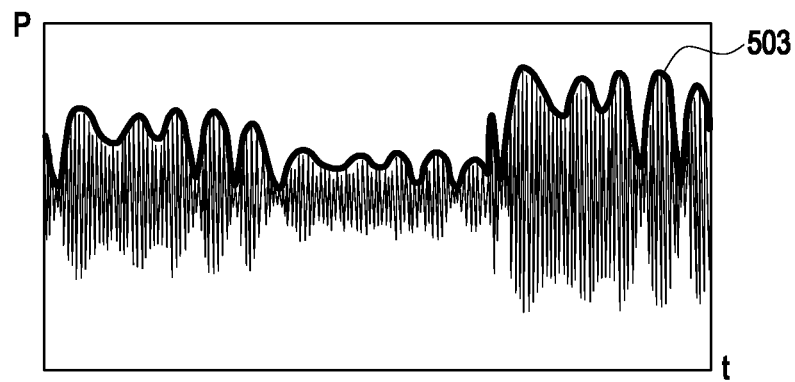

FIG. 5A, FIG. 5B, and FIG. 5C are graphs illustrating example power amplification modes of a power amplifier according to various embodiments. Referring to FIGS. 5A, 5B, and 5C, according to various embodiments, a power amplifier included in an RFFE of the electronic device may operate in various modes according to configurations. For example, a power amplifier may operate in a battery direct mode as illustrated in FIG. 5A, may operate in an average power tracking (APT) mode as illustrated in FIG. 5B, or may operate in an envelope tracking (ET) mode as illustrated in FIG. 5C.

In the battery direct mode illustrated in FIG. 5A, a directly configured value $V_{batt}$ may be input as an input power 501 of the power amplifier. The APT mode illustrated in FIG. 5B is a scheme of supplying as much input power 502 as needed for the electronic device, and may supply power configured according to configured time units (e.g., in units of subframes or units of slots). For example, in a case of operation in the APT mode, a power Vcc of 3V may be supplied to the power amplifier in a subframe (or slot) in which a transmission power of an RF signal is configured to 10 to 18 dBm, and a power Vcc of 4V may be supplied to the power amplifier in a subframe (or slot) in which the transmission power of the RF signal is configured to 18 to 24 dBm. In the ET mode illustrated in FIG. 5C, the electronic device 101 may control to supply the input power 503 to the power amplifier, by tracking, in real time, the magnitude of transmission power of an RF signal to be transmitted.

According to various embodiments, the power management circuit 310 may receive information corresponding to a power amplification mode from the CP 260, and may control power Vcc (e.g., input power) supplied to at least one power amplifier included in the RFFE 230, based on the received information corresponding to the power amplification mode. A detailed example thereof will be described in greater detail below with reference to FIG. 8A.

Figure 4:
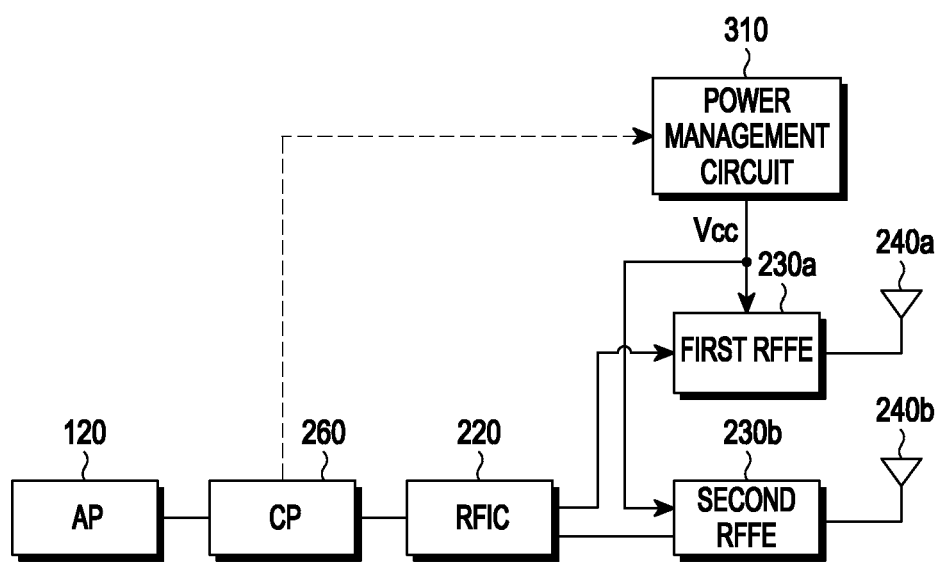
FIG. 4 is a block diagram illustrating an example configuration of the electronic device according to various embodiments.

FIG. 4 is a block diagram illustrating an example configuration of the electronic device according to various embodiments. Referring to FIG. 4, according to various embodiments, the electronic device 101 may include the AP 120, the CP 260, the RFIC 220, a first RFFE 230a, a second RFFE 230b, a first antenna 240a, a second antenna 240b, and the power management circuit 310 (e.g., the power management module 188 of FIG. 1). A baseband signal generated by the CP 260 may be transmitted to the RFIC 220. The RFIC 220 may modulate the baseband signal received from the CP 260 into a radio frequency (RF) signal. The RF signal modulated by the RFIC 220 may be input to any one RFFE selected based, for example, on a frequency band, a frequency bandwidth, or a power amplification mode (e.g., an ET mode or APT mode) of the first RFFE 230a or the second RFFE 230b. For example, the first RFFE 230a may be designed to be suitable for processing a first frequency band signal, and the second RFFE 230b may be designed to be suitable for processing a second frequency band signal. For example, the first RFFE 230a may be designed to be suitable for processing a first frequency bandwidth, and the second RFFE 230b may be designed to be suitable for processing a second frequency bandwidth. For example, the first RFFE 230a may be designed to operate in a first power amplification mode, and the second RFFE 230b may be designed to operate in a second power amplification mode.

According to various embodiments, if a frequency band of an RF signal to be transmitted is a first frequency band (e.g., a B2 band), the RF signal may be processed via the first RFFE 230a, and if the frequency band of the RF signal to be transmitted is a second frequency band (e.g., a B66 band), the RF signal may be processed via the second RFFE 230b. According to various embodiments, if the frequency bandwidth of the RF signal to be transmitted is a first bandwidth (e.g., 60 MHz), the RF signal may be processed via the first RFFE 230a, and if the frequency bandwidth of the RF signal to be transmitted is a second bandwidth (e.g., 100 MHz), the RF signal may be processed via the second RFFE 230b. According to various embodiments, if the RF signal to be transmitted is a signal processed based on the ET mode, the RF signal may be processed via the first RFFE 230a, and if the RF signal to be transmitted is a signal processed based on the APT mode, the RF signal may be processed via the second RFFE 230b.

According to various embodiments, the first RFFE 230a or the second RFFE 230b may process an RF signal of each radio frequency band. The first RFFE 230a or the second RFFE 230b of FIG. 4 may be implemented in various forms. For example, the first RFFE 230a or the second RFFE 230b may be configured in the form of a power amplifier module (PAM), a front-end module (FEM), a power amplifier module including a duplexer (PAMiD), an LNA and PAM with an integrated duplexer (LPAMID), and a PA with an integrated low noise amplifier and filter (LPAMIF). An RF signal input to the first RFFE 230a may be amplified into a signal of a desired size via a power amplifier and then transmitted to the first antenna 240a. The first antenna 240a may transmit the signal received from the first RFFE 230a. An RF signal input to the second RFFE 230b may be amplified into a signal of a desired size via a power amplifier and then transmitted to the second antenna 240b. The second antenna 240b may transmit the signal received from the second RFFE 230b.

According to various embodiments, the power management circuit 310 may be connected in parallel to the first RFFE 230a and the second RFFE 230b. The power management circuit 310 may supply input power Vcc in common to the power amplifiers of the first RFFE 230a and the second RFFE 230b. For example, the power management circuit 310 may supply input power to the power amplifiers, based on a power amplification mode of the power amplifiers. The power amplification mode may include at least one of a battery direct mode, an average power tracking (APT) mode, and an envelope tracking (ET) mode.

Figure 8A:
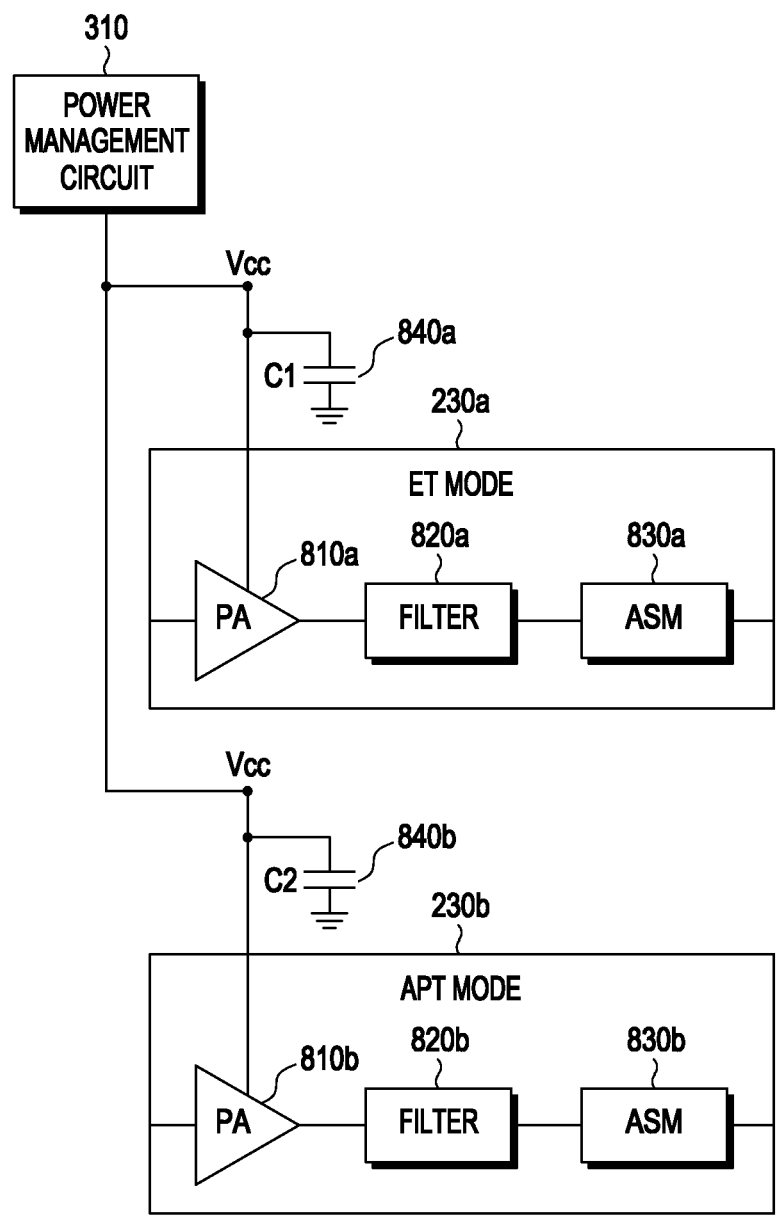
FIG. 8A is a block diagram illustrating an example configuration of the electronic device including multiple RFFEs according to various embodiments.
Figure 8B:
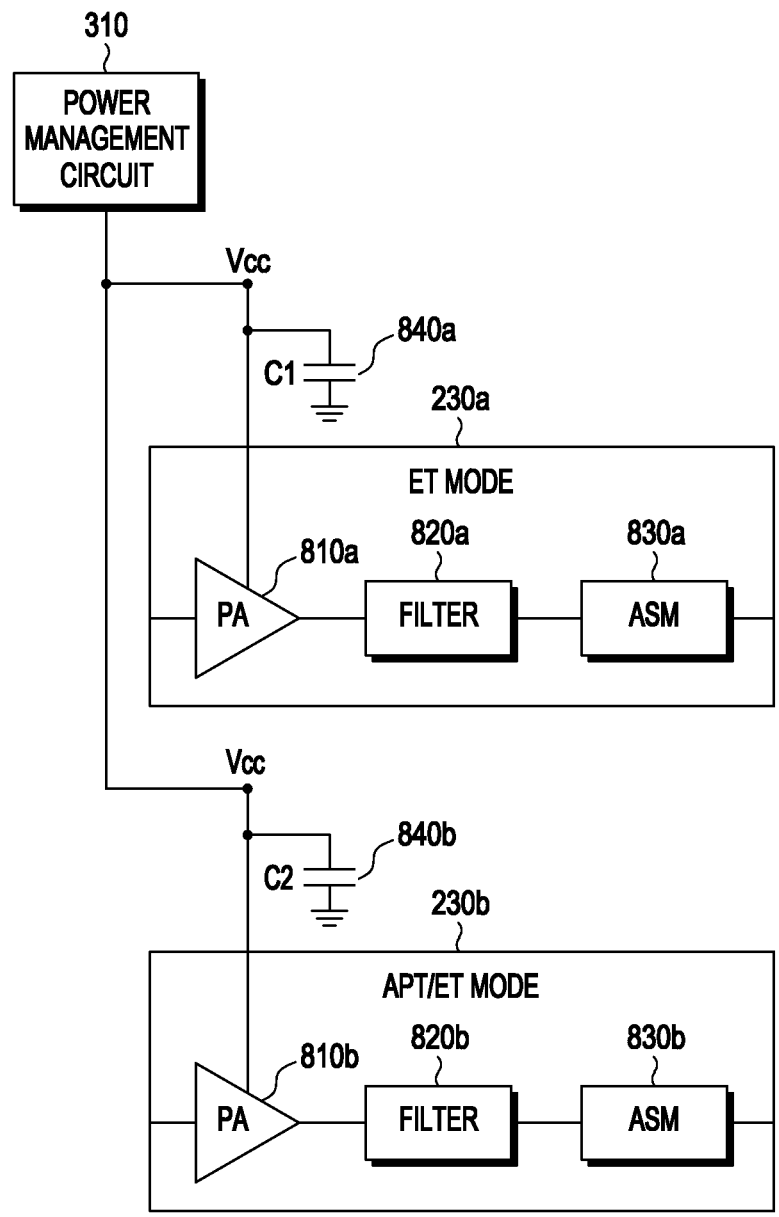
FIG. 8B is a block diagram illustrating an example configuration of the electronic device including multiple RFFEs according to various embodiments.
Figure 8C:
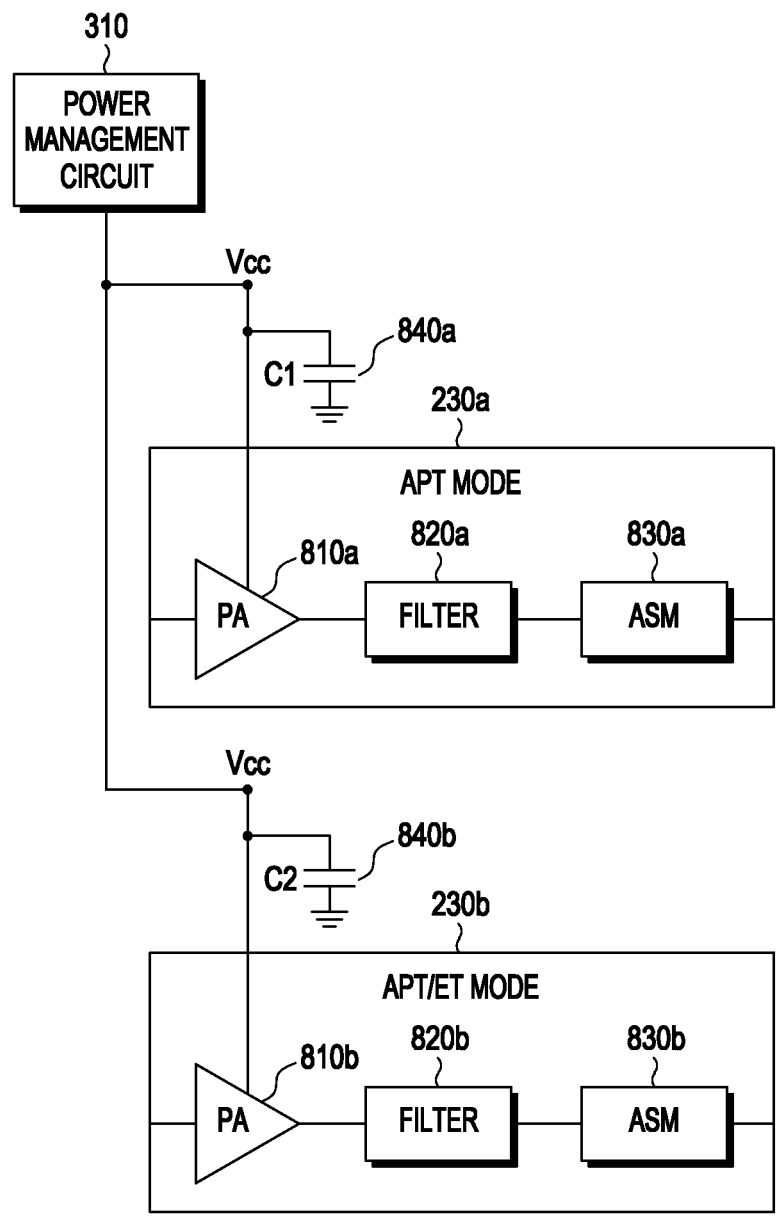
FIG. 8C is a block diagram illustrating an example configuration of the electronic device including multiple RFFEs according to various embodiments.

According to various embodiments, the power amplifier of the first RFFE 230a and the power amplifier of the second RFFE 230b may operate in different power amplification modes. For example, as illustrated in FIG. 8A, the first RFFE 230a may operate in the ET mode, and the second RFFE 230b may operate in the APT mode. For example, as illustrated in FIG. 8B, the first RFFE 230a may operate in the ET mode, and the second RFFE 230b may operate in the APT mode or the ET mode. For example, as shown in FIG. 8C, the first RFFE 230a may operate in the APT mode, and the second RFFE 230b may operate in the APT mode or the ET mode.

According to various embodiments, the power management circuit 310 may receive information corresponding to the power amplification mode from the CP 260, and may supply power (e.g., input power) to a power amplifier included in any one of the first RFFE 230a and the second RFFE 230b, based on the information corresponding to the received power amplification mode. A detailed example thereof will be described in greater detail below with reference to FIG. 8A.

Figure 6:
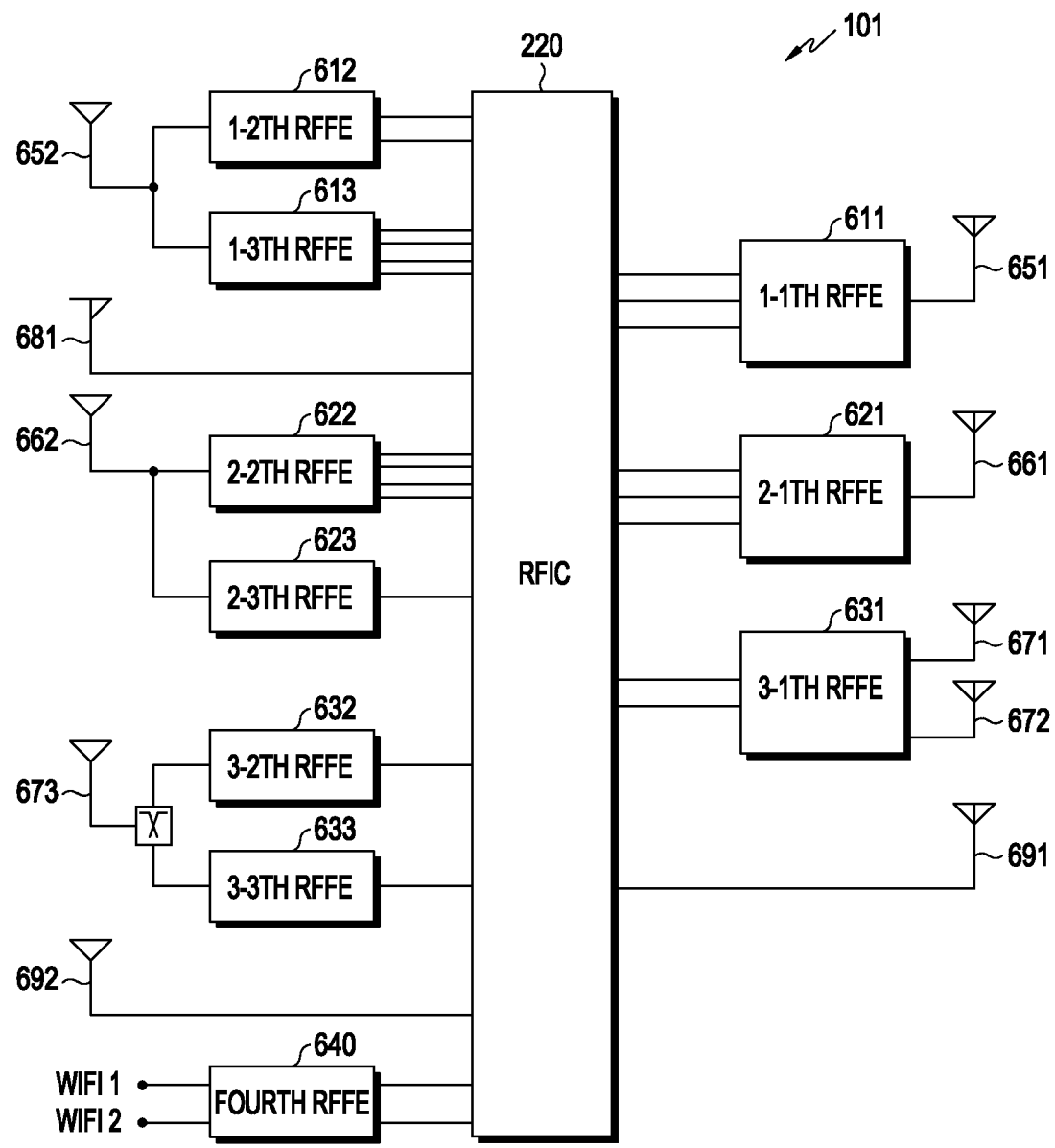
FIG. 6 is a block diagram illustrating an example configuration of the electronic device according to various embodiments.

FIG. 6 is a block diagram illustrating an example configuration of the electronic device according to various embodiments. Referring to FIG. 6, multiple RFFEs 611, 612, 613, 621, 622, 623, 631, 632, 633, and 640 may be connected to at least one RFIC 220. The multiple RFFEs 611, 612, 613, 621, 622, 623, 631, 632, 633, and 640 may be connected to multiple antennas 651, 652, 661, 662, 671, 672, 673, 681, 691, and 692.

According to various embodiments, a 1-1th RFFE 611 may be electrically connected to a first main antenna 651. A 2-1th RFFE 621 may be electrically connected to a second main antenna 661. A 1-2th RFFE 612 and a 1-3th RFFE 613 may be electrically connected to a first sub antenna 652 so that diversity with the first main antenna 651 may be provided. A 2-2th RFFE 622 and a 2-3th RFFE 623 may be electrically connected to a second sub antenna 662 so that diversity with the second main antenna 661 may be provided. A 3-1th RFFE 631 may be connected to two third main antennas 671 and 672 so as to provide MIMO. As another example, a 3-2th RFFE 632 and a 3-3th RFFE 633 may be connected to a third sub antenna 673 via a duplexer so that MIMO or diversity with the third main antennas 671 and 672 may be provided. As another example, a fifth antenna 681 may be directly connected from the RFIC 220 without going through an RFFE. As another example, a 6-1th antenna 691 and a 6-2th antenna 692 may also be directly connected from the RFIC 220 without going through an RFFE, and MIMO or diversity may be provided through two antennas. As another example, a fourth RFFE 640 may be connected to two Wi-Fi antennas.

According to various embodiments, at least one of the RFFEs in FIG. 6 may correspond to one of the RFFE 230, the first RFFE 230*a* and the second RFFE, 230*b* aforementioned in FIG. 3 and FIG. 4. At least one of the antennas of FIG. 6 may correspond to one of the antenna 240, the first antenna 240*a*, and the second antenna 240*b* aforementioned in FIG. 3 and FIG. 4.

Figure 7:
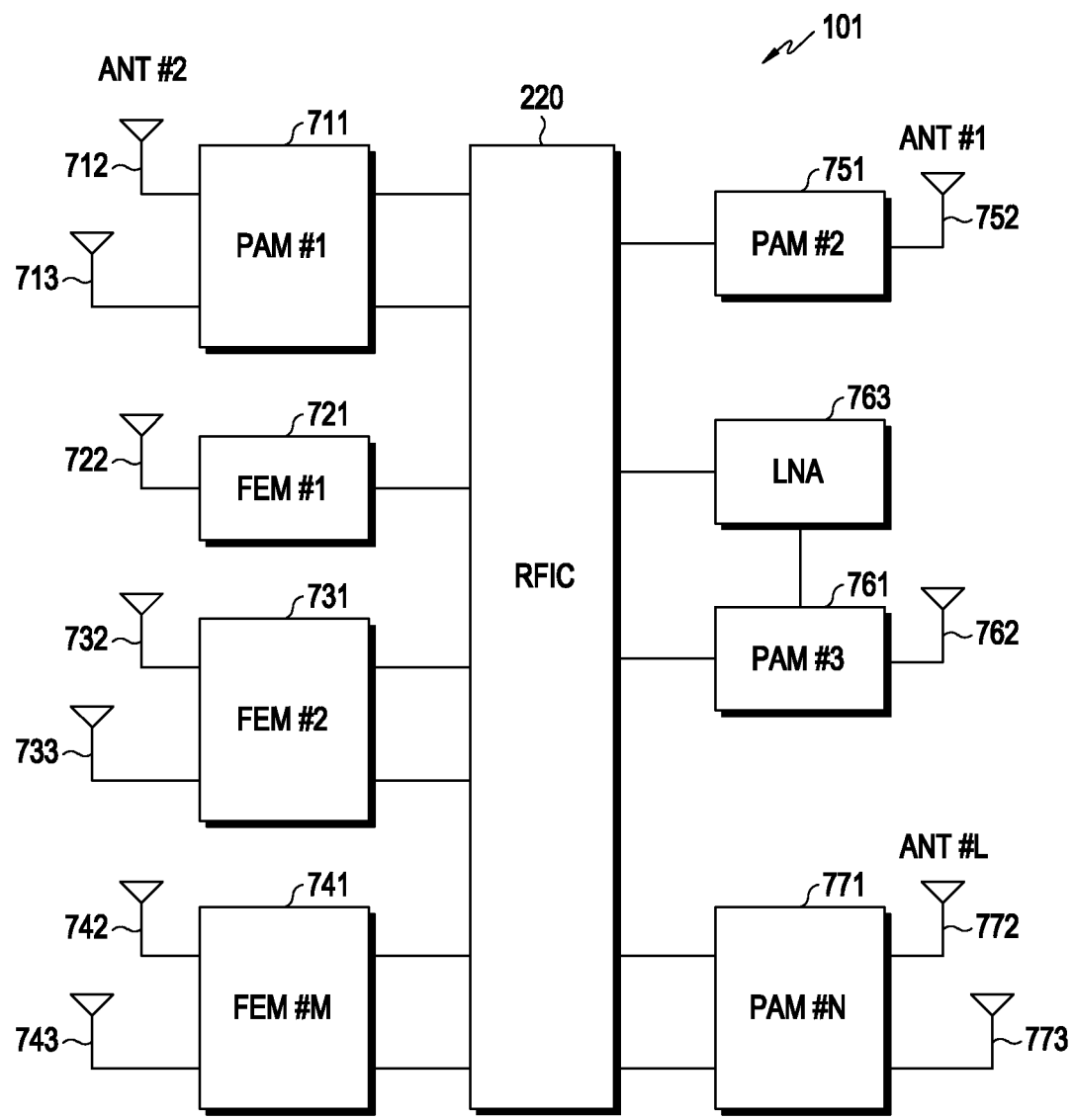
FIG. 7 is a block diagram illustrating an example configuration of the electronic device according to various embodiments.

FIG. 7 is a block diagram illustrating an example configuration of the electronic device according to various embodiments. Referring to FIG. 7, multiple PAMs 711, 751, 761, and 771, and/or multiple FEMs 721, 731, and 741 may be connected to at least one RFIC 220. The multiple PAMs 711, 751, 761, and 771 and/or the multiple FEMs 721, 731, and 741 may be connected to at least one antenna 712, 713, 722, 732, 733, 742, 743, 752, 762, 772, and 773, respectively.

Each of the multiple PAMs 711, 751, 761, and 771 may include at least one of a power amplifier (PA), and may amplify a transmission signal by the power amplifier so as to transmit the same through the antennas 712, 713, 752, 761, 772, and 773. The PAM #3 761 may be formed in the form of a power amplitude module including a duplexer (PAMiD) including at least one diplexer or at least one duplexer. The PAM #3 761 may transmit data received through the antenna 762 to an LNA 763 via the diplexer or duplexer. The data received in the LNA 763 may be low noise amplified and then transmitted to the RFIC 220. According to various embodiments, each of the multiple FEMs 721, 731, and 741 may include a low noise amplifier (LNA), and may amplify a reception signal by the power amplifier so as to transmit the same to the RFIC 220.

According to various embodiments, the PAM #1 711 may transmit or receive a mid-band or high-band 5G frequency (e.g., an N1 band, or N3 band) signal. The PAM #2 751 may transmit or receive an ultra-high band 5G frequency (e.g., an N78 band) signal. For example, if the electronic device 101 operates in SA, a 5G frequency signal may be transmitted or received via PAM #1 711 or PAM #N 771. If the electronic device 101 operates in EN-DC, a 5G frequency signal and an LTE frequency signal may be transmitted or received via PAM #1 711 and PAM #N 771, respectively.

FIG. 8A is a block diagram illustrating an example configuration of the electronic device including multiple RFFEs according to various embodiments. Referring to FIG. 8A, the electronic device 101 may include the power management circuit 310 (power management IC; PMIC), the first RFFE 230*a*, and the second RFFE 230*b*. The first RFFE 230*a* may include a first power amplifier 810*a*, a first filter 820*a*, and a first antenna switch module (ASM) 830*a*, but is not limited thereto. The second RFFE 230*b* may include a second power amplifier 810*b*, a second filter 820*b*, and a second antenna switch module (ASM) 830*b*, but is not limited thereto.

According to various embodiments, the power management circuit 310 may be connected in parallel to the first RFFE 230*a* and the second RFFE 230*b*. The power management circuit 310 may supply power (e.g., input power) Vcc to the first power amplifier 810*a* included in the first RFFE 230*a*, and may supply power (e.g., input power) Vcc to the second power amplifier 810*b* included in the second RFFE 230*b*. For example, if the electronic device 101 transmits an RF signal via the first RFFE 230*a*, the power management circuit 310 may be controlled, based on the ET mode, to supply power to the first power amplifier 810*a* included in the first RFFE, 230*a* so that the RF signal is not transmitted to the second RFFE 230*b*. According to various embodiments, the first RFFE 230*a* may process RF signals corresponding to multiple low-band frequencies (e.g., B5, B12, B13, and B17). For example, if a configured target power of an RF signal to be transmitted is greater than or equal to a configured value (e.g., 18 dBm), the first RFFE 230*a* supporting the ET mode may operate in the ET mode, and if the configured target power is less than the configured value, the first RFFE 230*a* may operate in the APT mode.

According to various embodiments, if the electronic device 101 transmits an RF signal via the second RFFE 230*b*, the power management circuit 310 may be controlled, based on the APT mode, to supply power to the second power amplifier 810*b* included in the second RFFE 230*b* so that the RF signal is not transmitted to the first RFFE 230*a*. According to various embodiments, the second RFFE 230*b* may process an RF signal of a frequency band (e.g., B41) that cannot be processed in the ET mode but can be processed only in the APT mode.

According to various embodiments, the CP 260 may select an RFFE to transmit an RF signal to be transmitted from among the first RFFE 230*a* and the second RFFE 230*b*, based on at least one of a frequency band, a frequency bandwidth, or a power amplification mode of the RF signal. The CP 260 may control to transmit the RF signal to be transmitted from the RFIC 220 to the selected RFFE.

According to various embodiments, a first capacitor 840*a* may be connected in parallel between the power management circuit 310 and the first RFFE 230*a*, and a second capacitor 840*b* may be connected in parallel between the power management circuit 310 and the second RFFE 230*b*. For example, the first capacitor 840*a* may use a component that does not exceed a reference (e.g., 750 pF) of the maximum capacitance allowed by a load of the power management circuit 310 for an ET mode operation.

According to various embodiments, the power management circuit 310 may supply power to the second power amplifier 810*b* included in the second RFFE 230*b* based on the APT mode, and the second capacitor 840*b* may use a component in consideration of capacitance configured for an APT mode operation.

According to various embodiments, when the electronic device 101 transmits an RF signal using the first RFFE 230*a* operating in the ET mode, not only the first capacitor 840*a* but the second capacitor 840*b* are connected in parallel, and therefore optimal performance for the ET mode may be unable to be provided. For example, the sum of the capacitance of the first capacitor 840*a* and the capacitance of the second capacitor 840*b* exceeds a reference (e.g., 750 pF) of the maximum capacitance that a load of the power management circuit 310 allows for the ET mode operation, and therefore the first RFFE 230*a* may not operate in the normal ET mode.

According to an embodiment, if each of the first RFFE 230*a* and the second RFFE 230*b* has a separate power management circuit to provide optimal performance according to a corresponding power amplification mode, costs of adding a component may increase and a space for mounting the component may be reduced.

FIG. 8B is a block diagram illustrating an example configuration of the electronic device including multiple RFFEs according to various embodiments. Referring to FIG. 8B, the electronic device 101 may include the power management circuit 310 (power management IC; PMIC), the first RFFE 230a, and the second RFFE 230b. The first RFFE 230a may include a first power amplifier 810a, a first filter 820a, and a first antenna switch module (ASM) 830a, but is not limited thereto. The second RFFE 230b may include a second power amplifier 810b, a second filter 820b, and a second antenna switch module (ASM) 830b, but is not limited thereto.

According to various embodiments, the power management circuit 310 may be connected in parallel to the first RFFE 230a and the second RFFE 230b. The power management circuit 310 may supply power (e.g., input power Vcc) to the first power amplifier 810a included in the first RFFE 230a, and may supply power (e.g., input power Vcc) to the second power amplifier 810b included in the second RFFE 230b. For example, if the electronic device 101 transmits an RF signal by the first RFFE 230a, the power management circuit 310 may be controlled, based on the ET mode, to supply power to the first power amplifier 810a included in the first RFFE, 230a so that the RF signal is not transmitted to the second RFFE 230b. If the electronic device 101 transmits an RF signal by the second RFFE 230b, the power management circuit 310 may be controlled, based on the APT mode or the ET mode, to supply power to the second power amplifier 810b included in the second RFFE 230b so that the RF signal is not transmitted to the first RFFE 230a. For example, power may be supplied according to the APT mode to an RF signal of an N41 frequency band among frequency bands processed by the second RFFE 230b, and power may be supplied according to the ET mode to a signal of an N2 or N66 frequency band.

According to various embodiments, a first capacitor 840a may be connected in parallel between the power management circuit 310 and the first RFFE 230a, and a second capacitor 840b may be connected in parallel between the power management circuit 310 and the second RFFE 230b. For example, the first capacitor 840a may use a component that does not exceed a reference (e.g., 750 pF) of the maximum capacitance allowed by the load of the power management circuit 310 for the ET mode operation. According to various embodiments, the power management circuit 310 may supply power to the second power amplifier 810b included in the second RFFE 230b based on the APT mode or the ET mode, and the second capacitor 840b may use a component in consideration of capacitance configured for the APT mode operation. According to various embodiments, when the electronic device 101 transmits an RF signal using the first RFFE 230a operating in the ET mode, not only the first capacitor 840a but the second capacitor 840b are connected in parallel, and therefore optimal performance for the ET mode may be unable to be provided. For example, the sum of the capacitance of the first capacitor 840a and the capacitance of the second capacitor 840b exceeds a reference (e.g., 750 pF) of the maximum capacitance that a load of the power management circuit 310 allows for the ET mode operation, and therefore the first RFFE 230a may not operate in the normal ET mode.

According to an embodiment, if each of the first RFFE 230a and the second RFFE 230b has a separate power management circuit to provide optimal performance according to a corresponding power amplification mode, costs of adding a component may increase and a space for mounting the component may be reduced.

FIG. 8C is a block diagram illustrating an example configuration of the electronic device including multiple RFFEs according to various embodiments. Referring to FIG. 8C, the electronic device 101 may include the power management circuit 310 (power management IC; PMIC), the first RFFE 230a, and the second RFFE 230b. The first RFFE 230a may include a first power amplifier 810a, a first filter 820a, and a first antenna switch module (ASM) 830a, but is not limited thereto. The second RFFE 230b may include a second power amplifier 810b, a second filter 820b, and a second antenna switch module (ASM) 830b, but is not limited thereto.

According to various embodiments, the power management circuit 310 may be connected in parallel to the first RFFE 230a and the second RFFE 230b. The power management circuit 310 may supply power (e.g., input power) Vcc to the first power amplifier 810a included in the first RFFE 230a, and may supply power (e.g., input power) Vcc to the second power amplifier 810b included in the second RFFE 230b. For example, if the electronic device 101 transmits an RF signal by the first RFFE 230a, the power management circuit 310 may be controlled, based on the APT mode, to supply power to the first power amplifier 810a included in the first RFFE 230a so that the RF signal is not transmitted to the second RFFE 230b. If the electronic device 101 transmits an RF signal by the second RFFE 230b, the power management circuit 310 may be controlled, based on the APT mode or the ET mode, to supply power to the second power amplifier 810b included in the second RFFE 230b so that the RF signal is not transmitted to the first RFFE 230a.

According to various embodiments, a first capacitor 840a may be connected in parallel between the power management circuit 310 and the first RFFE 230a, and a second capacitor 840b may be connected in parallel between the power management circuit 310 and the second RFFE 230b. For example, the second capacitor 840b may use a component that does not exceed a reference (e.g., 750 pF) of the maximum capacitance allowed by the load of the power management circuit 310 for the ET mode operation. According to various embodiments, the power management circuit 310 may supply power to the first power amplifier 810a included in the first RFFE 230a based on the APT mode, and the first capacitor 840a may use a component in consideration of capacitance configured for the APT mode operation. According to various embodiments, when the electronic device 101 transmits an RF signal using the second RFFE 230b operating in the APT mode or the ET mode, not only the second capacitor 840b but the first capacitor 840a are connected in parallel, and therefore optimal performance for the ET mode may be unable to be provided. For example, the sum of the capacitance of the first capacitor 840a and the capacitance of the second capacitor 840b exceeds a reference (e.g., 750 pF) of the maximum capacitance that the load of the power management circuit 310 allows for the ET mode operation, and therefore the second RFFE 230b may not operate in the normal ET mode.

According to an embodiment, if each of the first RFFE 230a and the second RFFE 230b has a separate power management circuit to provide optimal performance according to a corresponding power amplification mode, costs of adding a component may increase and a space for mounting the component may be reduced.

Figure 9:
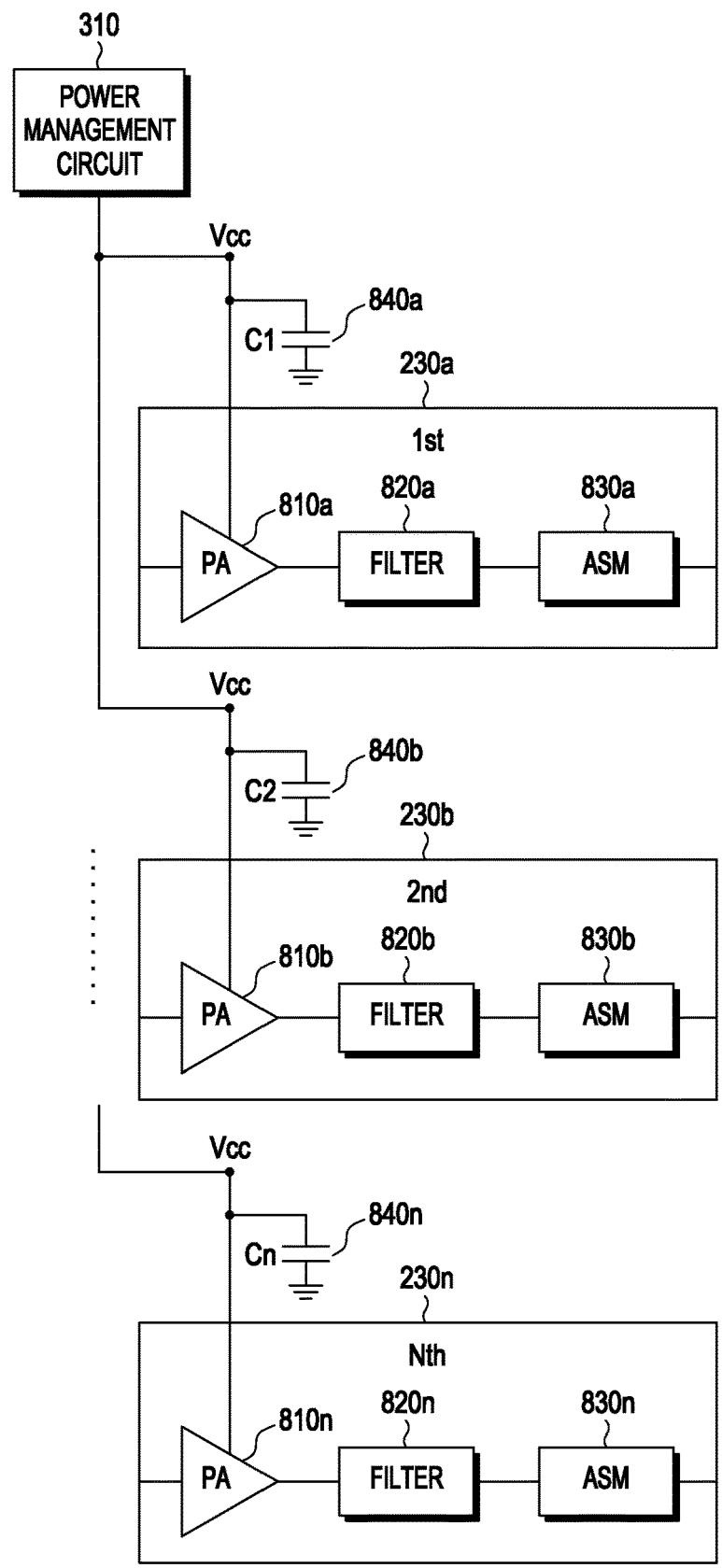
FIG. 9 is a block diagram illustrating an example configuration of the electronic device including multiple RFFEs according to various embodiments.

FIG. 9 is a block diagram illustrating an example configuration of the electronic device including multiple RFFEs according to various embodiments. Referring to FIG. 9, the electronic device 101 may include the power management circuit 310 (power management IC; PMIC), N RFFEs (e.g., the first RFFE 230a, the second RFFE 230b, the n-th RFFE 230n). The first RFFE 230a may include a first power amplifier 810a, a first filter 820a, and a first antenna switch module (ASM) 830a, but is not limited thereto. The second RFFE, 230b may include a second power amplifier 810b, a second filter 820b, and a second antenna switch module (ASM) 830b, but is not limited thereto. The nth RFFE, 230n may include an nth power amplifier 810n, an nth filter 820n, and an nth antenna switch module (ASM) 830n, but is not limited thereto.

According to various embodiments, the power management circuit 310 may be connected in parallel to the first RFFE 230a, the second RFFE 230b, . . . , and the nth RFFE 230n. The power management circuit 310 may supply power (e.g., input power) Vcc to the first power amplifier 810a included in the first RFFE 230a, to the second power amplifier 810b included in the second RFFE 230b, and to the n-th power amplifier 810n included in the n-th RFFE 230n.

According to various embodiments, the first capacitor 840a may be connected in parallel between the power management circuit 310 and the first RFFE 230a, the second capacitor 840b may be connected in parallel between the power management circuit 310 and the second RFFE 230b, and an nth capacitor 840n may be connected in parallel between the power management circuit 310 and the nth RFFE 230n.

The same power amplification mode or different power amplification modes may be applied to at least two RFFEs among the multiple RFFEs. As aforementioned in FIG. 8A, FIG. 8B, and FIG. 8C, different power amplification modes may be applied to respective RFFEs, but the capacitors connected to the respective RFFE cannot be installed so as to be optimized for a specific power amplification mode, so that optimal performance for each RFFE performance may be unable to be provided. For example, even if a capacitor optimized for each RFFE is connected in parallel to each RFFE, the capacitance for each RFFE overlaps by the number of the RFFEs, and thus the normal ET mode may not be supported.

Figure 10A:
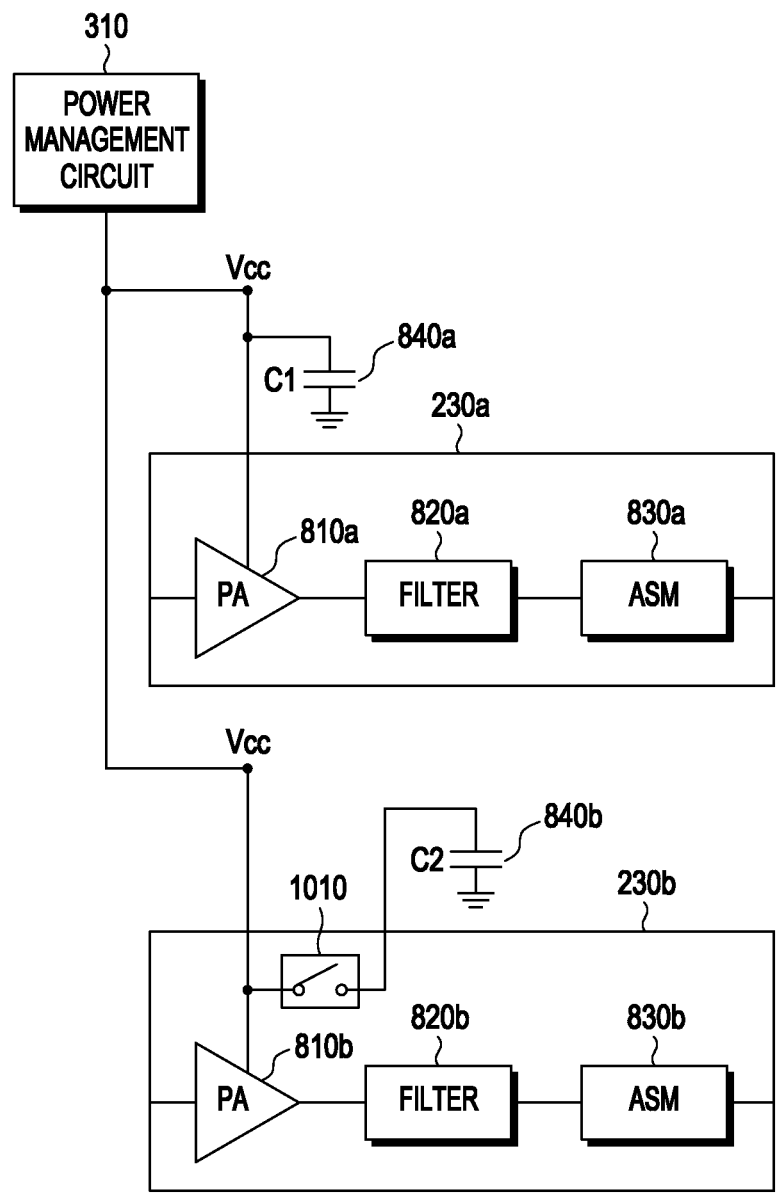
FIG. 10A is a block diagram illustrating an example configuration of the electronic device including multiple RFFEs according to various embodiments.

FIG. 10A is a block diagram illustrating an example configuration of the electronic device including multiple RFFEs according to various embodiments. Referring to FIG. 10A, the electronic device 101 may include the power management circuit 310 (e.g., power management IC (PMIC)), the first RFFE 230a, and the second RFFE 230b. The first RFFE 230a may include a first power amplifier 810a, a first filter 820a, and a first antenna switch module (ASM) 830a, but is not limited thereto. The second RFFE 230b may include a second power amplifier 810b, a second filter 820b, and a second antenna switch module (ASM) 830b, but is not limited thereto. For example, the first RFFE 230a may correspond to the first RFFE 230a in one of FIG. 8A, FIG. 8B, and FIG. 8C, and the second RFFE 230b may correspond to the second RFFE 230b in one of FIG. 8A, FIG. 8B, and FIG. 8C. According to various embodiments, the first RFFE 230a may support one power amplification mode of the ET mode, the APT mode, and the APT/ET mode, and the second RFFE 230b may support one of the ET mode, the APT mode, and the APT/ET mode.

According to various embodiments, a first capacitor 840a may be connected in parallel between the power management circuit 310 and the first RFFE 230a, and a second capacitor 840b may be connected in parallel between the power management circuit 310 and the second RFFE 230b. The second RFFE 230b may further include a switch 1010 between the power management circuit 310 and the second capacitor 840b.

According to various embodiments, if the electronic device 101 transmits an RF signal by the first RFFE 230a, the power management circuit 310 may be controlled, based on the ET mode, to supply power to the first power amplifier 810a included in the first RFFE 230a so that the RF signal is not transmitted to the second RFFE 230b. When the first RFFE 230a operates based on the ET mode, the switch 1010 included in the second RFFE 230b may be controlled to be in an off state. As the switch 1010 is controlled to be in the off state, the power management circuit 310 may be controlled not to be connected to the second capacitor 840b. Capacitance in the first RFFE 230a is not affected by the second capacitor 840b as the switch 1010 is controlled to the off state, so that the first RFFE 230a may provide optimal performance for the ET mode.

According to various embodiments, if the electronic device 101 transmits an RF signal by the second RFFE 230b, the power management circuit 310 may be controlled, based on the APT mode, to supply power to the second power amplifier 810b included in the second RFFE 230b so that the RF signal is not transmitted to the first RFFE 230a. According to various embodiments, the switch 1010 included in the second RFFE 230b may be controlled to be in an on state. As the switch 1010 is controlled to be in the on state, the power management circuit 310 may be controlled to be connected to the second capacitor 840b. Capacitance in the second RFFE 230b is determined based on the sum of the first capacitor 840a and the second capacitor 840b, and thus the second RFFE 230b may provide optimal performance for the APT mode.

According to various embodiments, in FIG. 10A, the first capacitor 840a or the second capacitor 840b is illustrated as being disposed outside the first RFFE 230a or the second RFFE 230b, but may be included within the first RFFE 230a or the second RFFE 230b.

According to various embodiments, if the switch 1010 is disposed inside the second RFFE 230b as illustrated in FIG. 10A, the switch 1010 may be controlled by a control signal provided through a mobile industry processor interface (MIPI) bus line of the RFIC 220.

Figure 10B:
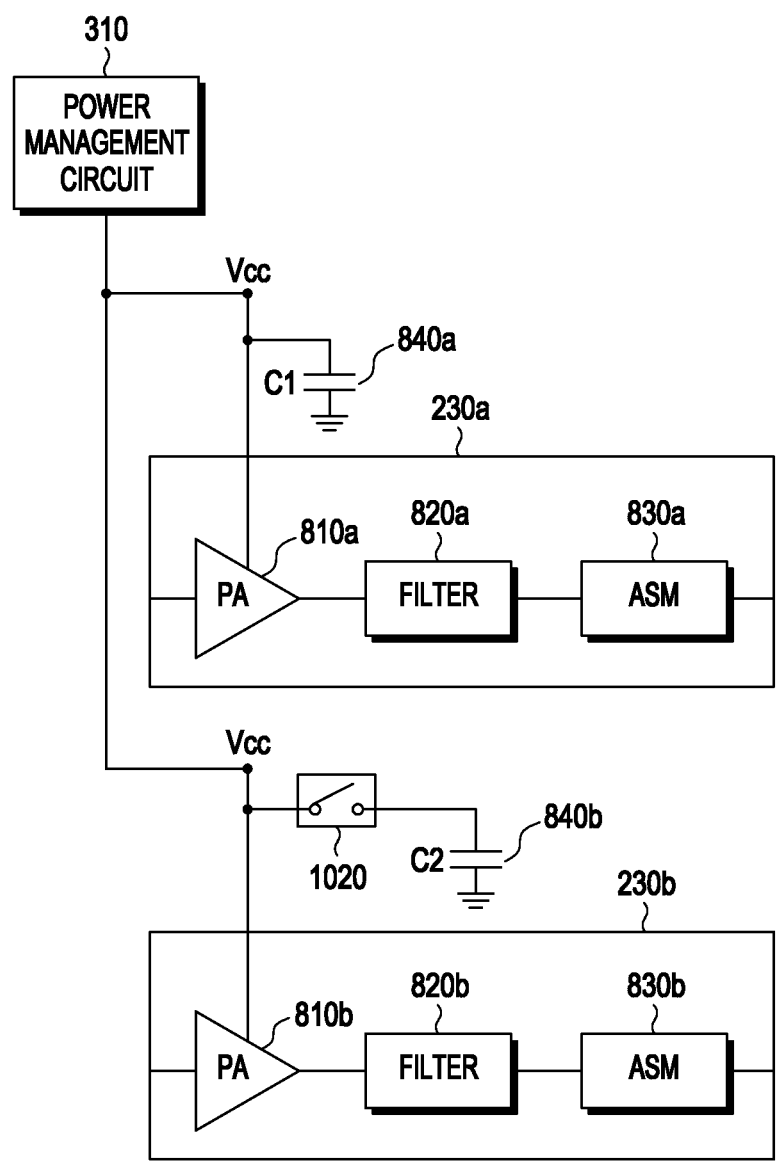
FIG. 10B is a block diagram illustrating an example configuration of the electronic device including multiple RFFEs according to various embodiments.

FIG. 10B is a block diagram illustrating an example configuration of the electronic device including multiple RFFEs according to various embodiments. Referring to FIG. 10B, in comparison with FIG. 10A, a switch 1020 for switching a connection with the second capacitor 840b may be disposed outside the second RFFE 230b. For example, for the second capacitor 840b connected in parallel between the power management circuit 310 and the second RFFE 230b, the connection to the power management circuit 310 may be controlled by the switch 1020 disposed outside the second RFFE 230b.

Figure 10C:
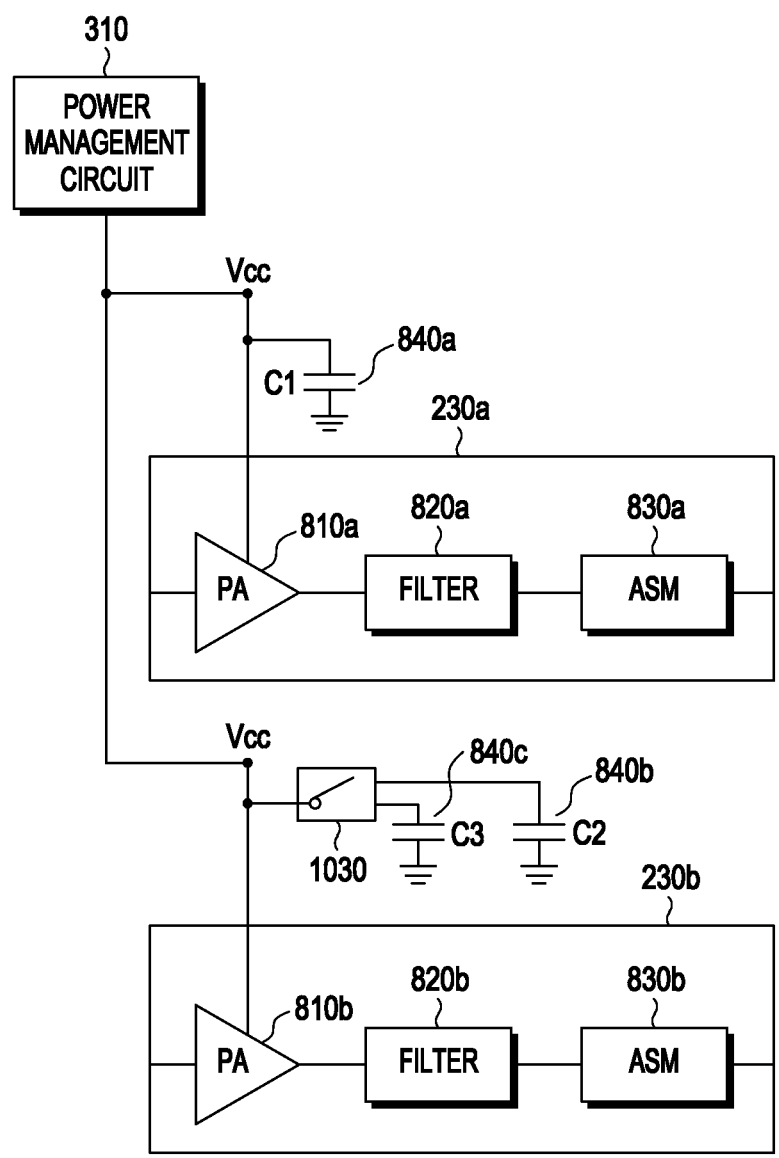
FIG. 10C is a block diagram illustrating an example configuration of the electronic device including multiple RFFEs according to various embodiments.

FIG. 10C is a block diagram illustrating an example configuration of the electronic device including multiple RFFEs according to various embodiments. Referring to FIG. 10C, the electronic device 101 may include the power management circuit 310 (power management IC; PMIC), the first RFFE 230a, and the second RFFE 230b. The first RFFE 230a may include a first power amplifier 810a, a first filter 820a, and a first antenna switch module (ASM) 830a, but is not limited thereto. The second RFFE 230b may include a second power amplifier 810b, a second filter 820b, and a second antenna switch module (ASM) 830b, but is not limited thereto.

According to various embodiments, the first capacitor 840a may be connected in parallel between the power management circuit 310 and the first RFFE 230a, and the second capacitor 840b and a third capacitor 840c may be connected in parallel between the power management circuit 310 and the second RFFE 230b. The second RFFE 230b may further include a switch 1030 between the power management circuit 310, the second capacitor 840b, and the third capacitor 840c.

According to various embodiments, if the electronic device 101 transmits an RF signal by the first RFFE 230a, the power management circuit 310 may be controlled, based on the ET mode, to supply power to the first power amplifier 810a included in the first RFFE 230a so that the RF signal is not transmitted to the second RFFE 230b. According to various embodiments, the switch 1030 connected to the second RFFE 230b may be controlled to allow connection to the second capacitor 840b or the third capacitor 840c. According to various embodiments, if the electronic device 101 transmits an RF signal by the second RFFE 230b, the power management circuit 310 may be controlled, based on the APT mode, to supply power to the second power amplifier 810b included in the second RFFE 230b so that the RF signal is not transmitted to the first RFFE 230a. According to various embodiments, the switch 1030 connected to the second RFFE 230b may be controlled to allow connection to the second capacitor 840b or the third capacitor 840c. According to various embodiments, optimal performance may be provided by controlling the switch 1030 to allow connection to the second capacitor 840b or the third capacitor 840c, based on each power amplification mode.

According to various embodiments, FIG. 10C illustrates that two capacitors (e.g., the second capacitor 840b and the third capacitor 840c) are connected to the second RFFE 230b, it may be implemented that three or more capacitors are connected in parallel. According to various embodiments, in FIG. 10C, the first capacitor 810a may be connected to the second RFFE 230b without being connected to the first RFFE 230a. For example, the first capacitor 840a may be connected in parallel with the second capacitor 840b or the third capacitor 840c, and the switch 1030 may be controlled to allow connection to one of the first capacitor 840a, the second capacitor 840b, or the third capacitor 840c according to the power amplification mode.

Figure 11:
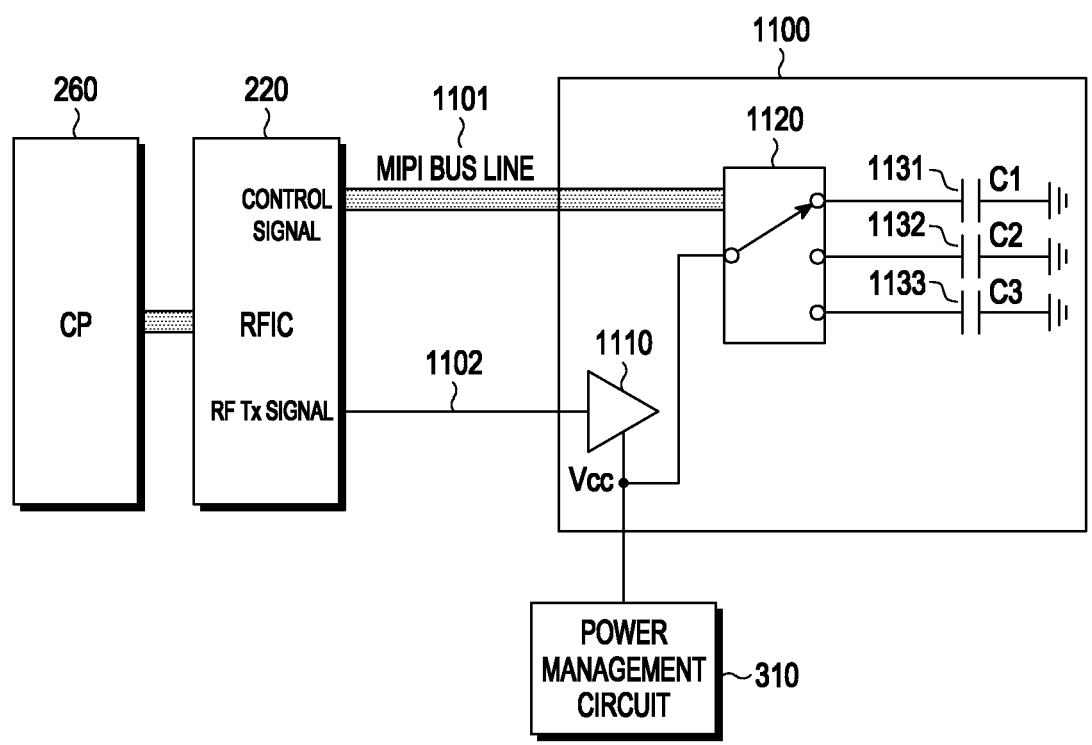
FIG. 11 is a block diagram illustrating an example configuration of the electronic device according to various embodiments.

FIG. 11 is a block diagram illustrating an example configuration of the electronic device according to various embodiments. Referring to FIG. 11, according to various embodiments, the electronic device 101 may include the CP 260, the RFIC 220, an RFFE 1100, and the power management circuit 310 (e.g., the power management module 188 of FIG. 1). It is illustrated that the electronic device 101 illustrated in FIG. 11 includes one RFFE 1100, but according to various embodiments, multiple RFFEs may be included FIG. 4, FIG. 8A, FIG. 8B, FIG. 8C, FIG. 9, FIG. 10A, FIG. 10B, and FIG. 10C.

According to various embodiments, a baseband signal generated by the CP 260 may be transmitted to the RFIC 220. The RFIC 220 may modulate the baseband signal received from the CP 260 into a radio frequency (RF) signal. The RF signal modulated by the RFIC 220 may be input to a power amplifier 1110 of the RFFE 1100 via an RF signal transmission line 1102. The RFFE 1100 may include, but is not limited to, a power amplifier (PA) 1110, a filter, or an antenna switching module (ASM). The RFFE 1100 may include a switch 1120 and at least one capacitor (e.g., a first capacitor (C1) 1131, a second capacitor (C2) 1132, and a third capacitor (C3) 1133).

According to various embodiments, the RFIC 220 may transmit a control signal to the RFFE 1100 through a MIPI bus line 1101. For example, the electronic device 101 may transmit a control signal for controlling the switch 1120 from the RFIC 220 through the MIPI bus line 1101. The switch 1120 included in the RFFE 1100 may be switched so that one of the first capacitor 1131, the second capacitor 1132, or the third capacitor 1133 is connected to a power input terminal of the power amplifier 1110, based on the control signal received through the MIPI bus line 1101.

According to various embodiments, the control signal for controlling the switch 1120 may be configured based on a frequency band of the RF signal and/or a frequency bandwidth of the RF signal. For example, the control signal may be configured based on the frequency bandwidth of the RF signal as shown in Table 1 below.

TABLE 1

| Band | Capacitance | BW | Transmission line |
| --- | --- | --- | --- |
| Band41 | 1(10 pF)_ET<br>2(200 pF)_APT | 60 MHz<br>100 MHz | MIPI bus |

Referring to <Table 1>, if the RF signal transmitted from the RFIC 220 is an RF signal of a B41 band and is a signal having a bandwidth of 60 MHz, the RFFE 1100 may operate in the ET mode, and the switch 1120 is controlled via the MIPI bus line 1101, so that capacitance may be 10 pF. If the RF signal transmitted from the RFIC 220 is an RF signal of the B41 band and is a signal having a bandwidth of 100 MHz, the ET mode cannot be supported and the RFFE 1100 may thus operate in the APT mode, and the switch 1120 is controlled via the MIPI bus line 1101, so that capacitance may be 200 pF.

According to various embodiments, the control signal may be configured based on the frequency band of the RF signal as shown in <Table 2> below.

TABLE 2

| Band | Capacitance | Transmission line |
| --- | --- | --- |
| Band2<br>Band66 | 1(10 pF)<br>2(200 pF) | MIPI bus |

Referring to <Table 2>, if the RF signal transmitted from the RFIC 220 is an RF signal of a B2 band, the RFFE 1100 may operate in the ATP mode, and the switch 1120 is controlled via the MIPI bus line 1101, so that capacitance may be 10 pF suitable for a signal of the B2 band. If the RF signal transmitted from the RFIC 220 is an RF signal of the B66 band, the RFFE 1100 may operate in the ATP mode, and the switch 1120 is controlled via the MIPI bus line 1101, so that capacitance may be 200 pF suitable for a signal of the B66 band.

According to various embodiments, a control signal transmitted from the RFIC 220 through the MIPI bus line 1101 may include a value corresponding to each node to which the switch 1120 is connected. As another example, the control signal transmitted from the RFIC 220 through the MIPI bus line 1101 may include a frequency band and/or information corresponding to a frequency bandwidth. The RFFE 1100 may control the operation of the switch 1120 by generating a control signal for controlling connection of the switch 1120, based on the frequency band and/or information corresponding to the frequency bandwidth. As another example, the control signal transmitted from the RFIC 220 through the MIPI bus line 1101 may include information corresponding to a power amplification mode (e.g., the ET mode and the APT mode). The RFFE 1100 may control the operation of the switch 1120 by generating a control signal for controlling connection of the switch 1120, based on information corresponding to the power amplification mode.

According to various embodiments, although FIG. 11 illustrates that the RFFE 1100 includes three capacitors, the disclosure is not limited thereto. For example, the RFFE 1100 may include one or two capacitors, or may include four or more capacitors. According to various embodiments, the number of capacitors may be configured to correspond to the number of frequency bands of an RF signal processed by the RFFE 1100. For example, if the frequency band of the RF signal processed by the RFFE 1100 is three frequency bands, three capacitors may be disposed to have optimal capacitance according to each frequency band.

Figure 12:
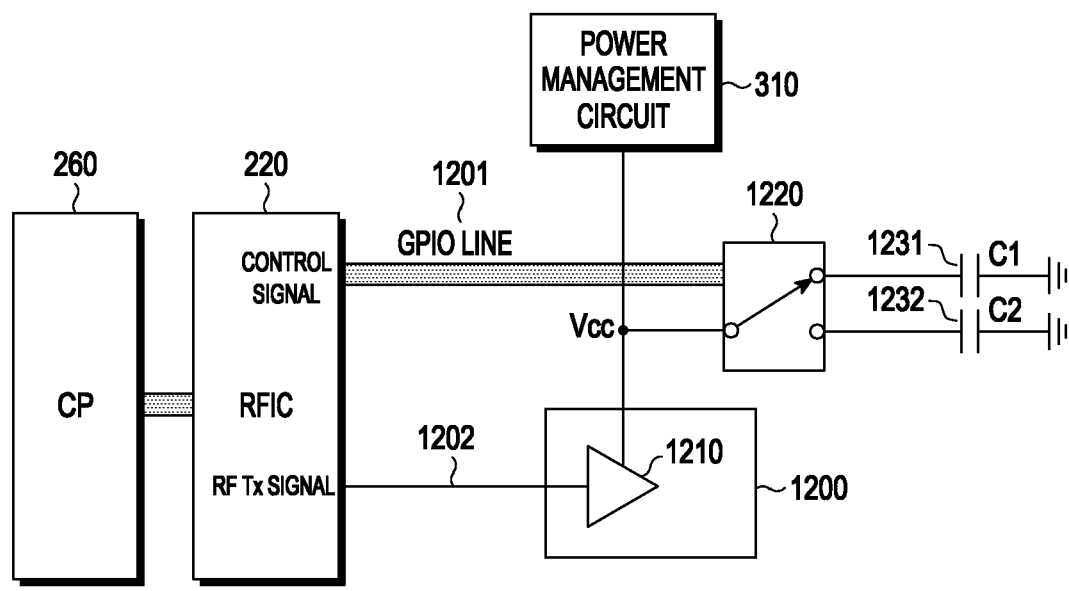
FIG. 12 is a block diagram illustrating an example configuration of the electronic device according to various embodiments.

FIG. 12 is a block diagram illustrating an example configuration of the electronic device according to various embodiments. Referring to FIG. 12, according to various embodiments, the electronic device 101 may include the CP 260, the RFIC 220, an RFFE 1200, the power management circuit 310 (e.g., the power management module 188 of FIG. 1), a switch 1220, and at least one capacitor (e.g., a first capacitor (C1) 1231 and a second capacitor (C2) 1232). It is illustrated that the electronic device 101 illustrated in FIG. 12 includes one RFFE 1200, but according to various embodiments, multiple RFFEs may be included FIG. 4, FIG. 8A, FIG. 8B, FIG. 8C, FIG. 9, FIG. 10A, FIG. 10B, and FIG. 10C.

According to various embodiments, a baseband signal generated by the CP 260 may be transmitted to the RFIC 220. The RFIC 220 may modulate the baseband signal received from the CP 260 into a radio frequency (RF) signal. The RF signal modulated by the RFIC 220 may be input to a power amplifier 1210 of the RFFE 1200 via an RF signal transmission line 1202. The RFFE 1200 may include, but is not limited to, a power amplifier (PA), a filter, or an antenna switching module (ASM).

According to various embodiments, the RFIC 220 may transmit a control signal to the switch 1220 through a general-purpose input and output (GPIO) line 120. For example, the electronic device 101 may transmit a control signal for controlling the switch 1220 from the RFIC 220 through the GPIO line 1201. The switch 1220 may be switched so that one of a first capacitor 1231 or a second capacitor 1232 is connected to a power input terminal of the power amplifier 1210, based on the control signal received through the GPIO line 1201.

According to various embodiments, the control signal for controlling the switch 1220 may be configured based on a frequency band of the RF signal and/or a frequency bandwidth of the RF signal. For example, the control signal may be configured based on the frequency bandwidth of the RF signal as shown in Table 3 below.

TABLE 3

| Band | Capacitance | BW | Transmission line |
|---|---|---|---|
| Band41 | 1(10 pF)_ET<br>2(200 pF)_APT | 60 MHz<br>100 MHz | GPIO line |

Referring to <Table 3>, if the RF signal transmitted from the RFIC 220 is an RF signal of the B41 band and is a signal having a bandwidth of 60 MHz, the RFFE 1200 may operate in the ET mode, and the switch 1220 may be controlled by transmission of a "high" signal through the GPIO line 1201, so that capacitance is 10 pF. If the RF signal transmitted from the RFIC 220 is an RF signal of the B41 band and is a signal having a bandwidth of 100 MHz, the ET mode cannot be supported and the RFFE 1200 may thus operate in the APT mode, and the switch 1220 may be controlled by transmission of a "low" signal through the GPIO line 1201, so that capacitance may be 200 pF.

According to various embodiments, the control signal may be configured based on the frequency band of the RF signal as shown in <Table 4> below.

TABLE 4

| Band | Capacitance | Transmission line |
|---|---|---|
| Band2 | 1(10 pF) | GPIO line |
| Band66 | 2(200 pF) | |

Referring to <Table 4>, if the RF signal transmitted from the RFIC 220 is an RF signal of the B2 band, the RFFE 1200 may operate in the ATP mode, and the switch 1220 may be controlled by transmission of a "high" signal through the GPIO line 1201, so that capacitance may be 10 pF suitable for a signal of the B2 band. If the RF signal transmitted from the RFIC 220 is an RF signal of the B66 band, the RFFE 1200 may operate in the ATP mode, and the switch 1220 may be controlled by transmission of a "low" signal through the GPIO line 1201, so that capacitance may be 200 pF suitable for a signal of the B66 band.

Figure 13:
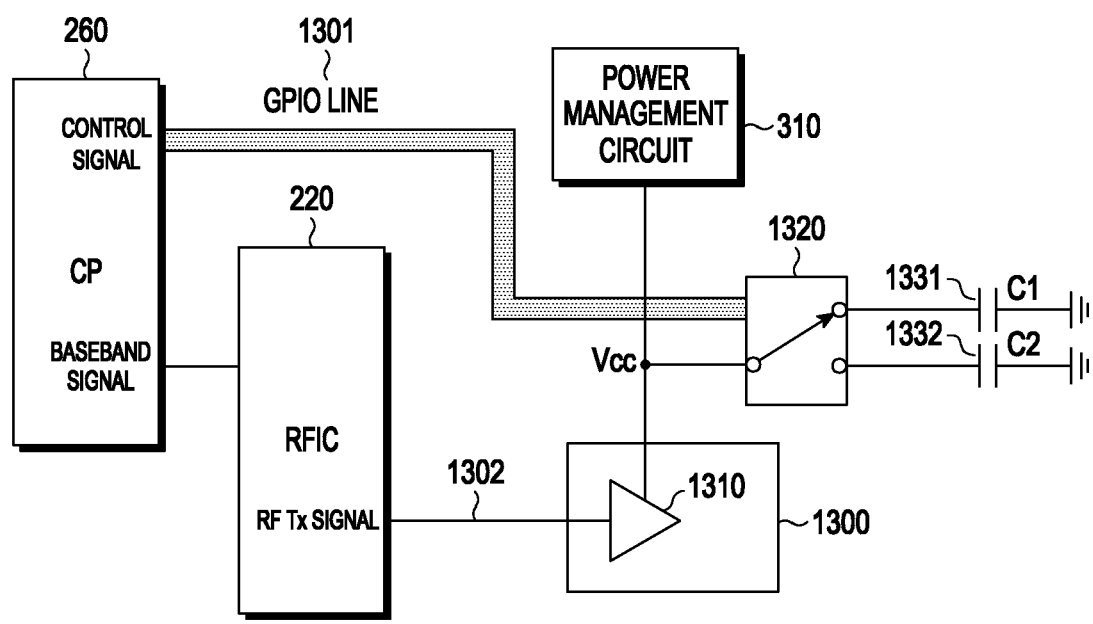
FIG. 13 is a block diagram illustrating an example configuration of the electronic device according to various embodiments.

FIG. 13 is a block diagram illustrating an example configuration of the electronic device according to various embodiments. Referring to FIG. 13, according to various embodiments, the electronic device 101 may include the CP 260, the RFIC 220, an RFFE 1300, the power management circuit 310 (e.g., the power management module 188 of FIG. 1), a switch 1320, and at least one capacitor (e.g., a first capacitor (C1) 1331 and a second capacitor (C2) 1332). It is illustrated that the electronic device 101 illustrated in FIG. 13 includes one RFFE 1300, but according to various embodiments, multiple RFFEs may be included FIG. 4, FIG. 8A, FIG. 8B, FIG. 8C, FIG. 9, FIG. 10A, FIG. 10B, and FIG. 10C.

According to various embodiments, a baseband signal generated by the CP 260 may be transmitted to the RFIC 220. The RFIC 220 may modulate the baseband signal received from the CP 260 into a radio frequency (RF) signal. The RF signal modulated by the RFIC 220 may be input to a power amplifier 1310 of the RFFE 1300 via an RF signal transmission line 1302. The RFFE 1300 may include, but is not limited to, a power amplifier (PA), a filter, or an antenna switching module (ASM).

According to various embodiments, the CP 260 may transmit a control signal to the switch 1320 through a general-purpose input and output (GPIO) line 1301. For example, the electronic device 101 may transmit a control signal for controlling the switch 1320 from the CP 260 through the GPIO line 1301. The switch 1320 may be switched so that one of a first capacitor 1331 or a second capacitor 1332 is connected to a power input terminal of the power amplifier 1310, based on the control signal received through the GPIO line 1301.

According to various embodiments, the control signal for controlling the switch 1320 may be configured based on a frequency band of the RF signal and/or a frequency bandwidth of the RF signal. For example, the control signal may be configured based on the frequency bandwidth of the RF signal as shown in aforementioned <Table 3>. For example, if the RF signal transmitted from the RFIC 220 is an RF signal of the B41 band and is a signal having a bandwidth of 60 MHz, the RFFE 1300 may operate in the ET mode, and the switch 1320 may be controlled by transmission of a "high" signal through the GPIO line 1301, so that capacitance is 10 pF. If the RF signal transmitted from the RFIC 220 is an RF signal of the B41 band and is a signal having a bandwidth of 100 MHz, the ET mode cannot be supported and the RFFE 1300 may thus operate in the APT mode, and the switch 1320 may be controlled by transmission of a "low" signal through the GPIO line 1301, so that capacitance may be 200 pF.

According to various embodiments, the control signal may be configured based on the frequency band of the RF signal as shown in aforementioned <Table 4>. For example, if the RF signal transmitted from the RFIC 220 is an RF signal of the B2 band, the RFFE 1300 may operate in the ATP mode, and the switch 1320 may be controlled by transmission of a "high" signal through the GPIO line 1301, so that capacitance may be 10 pF suitable for a signal of the B2 band. If the RF signal transmitted from the RFIC 220 is an RF signal of the B66 band, the RFFE 1300 may operate in the ATP mode, and the switch 1320 may be controlled by transmission of a "low" signal through the GPIO line 1301, so that capacitance may be 200 pF suitable for a signal of the B66 band.

Figure 14:
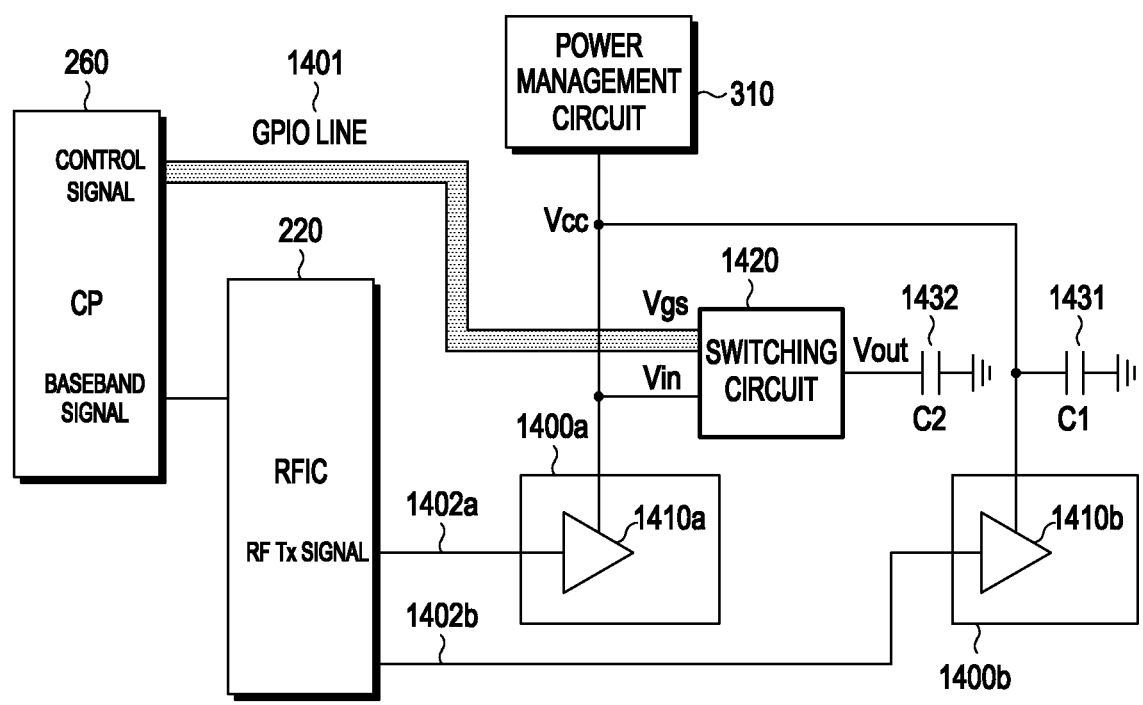
FIG. 14 is a block diagram illustrating an example configuration of the electronic device according to various embodiments.

FIG. 14 is a block diagram illustrating an example configuration of the electronic device according to various embodiments. Referring to FIG. 14, according to various embodiments, the electronic device 101 may include the CP 260, the RFIC 220, a first RFFE 1400a, a second RFFE 1400b, the power management circuit 310 (e.g., the power management module 188 of FIG. 1), a switching circuit 1420, a first capacitor (C1) 1431, and a second capacitor (C2) 1432.

According to various embodiments, a baseband signal generated by the CP 260 may be transmitted to the RFIC 220. The RFIC 220 may modulate the baseband signal received from the CP 260 into a radio frequency (RF) signal. The RF signal modulated by the RFIC 220 may be input to a first power amplifier 1410a of the first RFFE 1400a or a second power amplifier 1410b of the second RFFE 1400b through a first RF signal transmission line 1402a or a second RF signal transmission line 1402b. The first RFFE 1400a or the second RFFE 1400b may include a power amplifier (PA) 1410a, 1410b, a filter, or an antenna switching module (ASM), but is not limited thereto.

According to various embodiments, the CP 260 may transmit a control signal to the switching circuit 1420 through a general-purpose input and output (GPIO) line 1401. For example, the electronic device 101 may transmit a control signal for controlling the switching circuit 1420 from the CP 260 through the GPIO line 1401. The switching circuit 1420 may control connection to a second capacitor 1432, based on the control signal received through the GPIO line 1401.

According to various embodiments, the control signal for controlling the switching circuit 1420 may be configured based on a frequency band of the RF signal and/or a frequency bandwidth of the RF signal.

According to various embodiments, if the RF signal is transmitted to the first RFFE 1400a through the first RF signal transmission line 1402a, and the first RFFE 1400a operates in the ET mode, the switching circuit 1420 is controlled by transmission of a "high" signal through the GPIO line 1401, so that the connection to a second capacitor 1430 is in an open state. If the RF signal is transmitted to the second RFFE 1400b through the second RF signal transmission line 1402b, and the second RFFE 1400b operates in the APT mode, the switching circuit 1420 is controlled by transmission of a "low" signal through the GPIO line 1401, so that the second capacitor 1430 is connected to the second RFFE 1400b.

Figure 15:
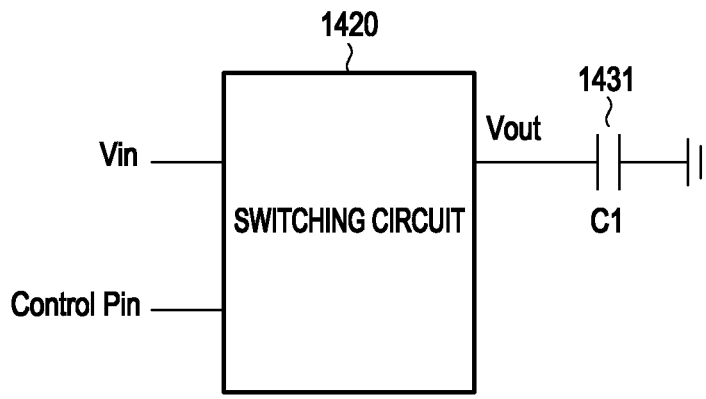
FIG. 15 is a diagram illustrating an example switching circuit of the electronic device according to various embodiments.

FIG. 15 is a diagram illustrating an example switching circuit of the electronic device according to various embodiments. Referring to FIG. 15, the switching circuit 1420 may control connection between Vin and Vout according to a control signal (e.g., Vgs) input to a control terminal (control pin). For example, the switching circuit 1420 may control connection between a Vin terminal and a Vout terminal according to a control signal (e.g., Vgs) input to the control terminal (control pin) so as to control connection to a first capacitor 1431.

Figure 16:
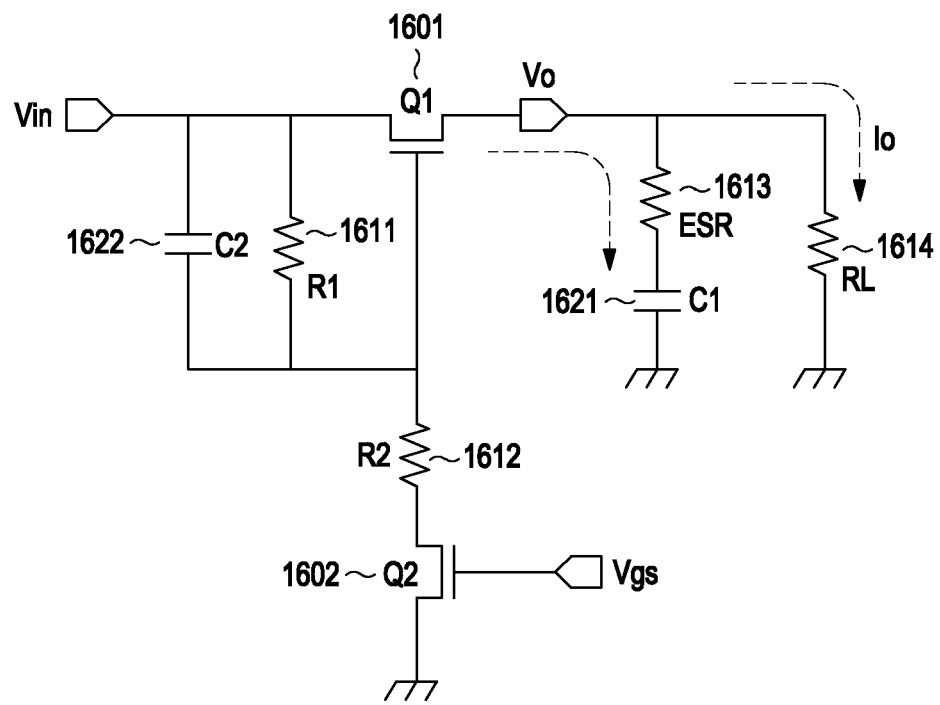
FIG. 16 is a circuit diagram illustrating an example switching circuit of the electronic device according to various embodiments.

FIG. 16 is a circuit diagram illustrating an example switching circuit of the electronic device according to various embodiments. Referring to FIG. 16, the switching circuit 1420 of FIG. 15 may include at least one resistor (R1 1611, R2 1612, ESR 1613, and RL 1614), at least one capacitor (C1 1621 and C2 1622), and at least one field-effect transistor (FET) (Q1 1601 and Q2 1602).

According to various embodiments, the control signal transmitted through the GPIO lines 1301 and 1401 of the RFIC 220 or the CP 260 may be supplied, as Vgs voltage, to a gate terminal of Q2 1602. Q2 1602 may be turned on/off according to the control signal, and Q1 1601 may be on/off controlled according to the on/off control of the Q2 1602. According to the on/off control of Q1 1601, a Vin terminal and a Vout terminal may be connected or may be in an open state. For example, the power management circuit 310 may supply power (e.g., Vin) for driving the switching circuit 1420. The CP 260 or the power management circuit 310 may provide Vgs to the gate terminal of Q2 1602, as the control signal for controlling on/off of Q2 1602. According to various embodiments, if voltage corresponding to a "high" signal is applied to the gate terminal of Q2 1602 by the control signal in the ATP mode, Q2 1602 is turned on, and as Q2 1602 is turned on, a potential difference may occur between the gate terminal and Vin voltage applied to a source terminal of Q1 1601 so that Q1 1601 may be turned on. When Q1 1601 is turned on, the Vin terminal may be connected to Vout, and C1 1621 connected to the Vout may be connected to the Vin terminal. According to various embodiments, if voltage corresponding to a "low" signal is applied to the gate terminal of Q2 1602 by the control signal in the ET mode, Q2 1602 is turned off, and as Q2 1602 is turned off, no potential difference may occur between the gate terminal and Vin voltage applied to the source terminal of Q1 1601 so that Q1 1601 may be turned off. When Q1 1601 is turned off, the Vin terminal and Vout may be in an open state, and the Vin terminal and C1 1621 connected to the Vout may be in an open state.

Figure 17A:
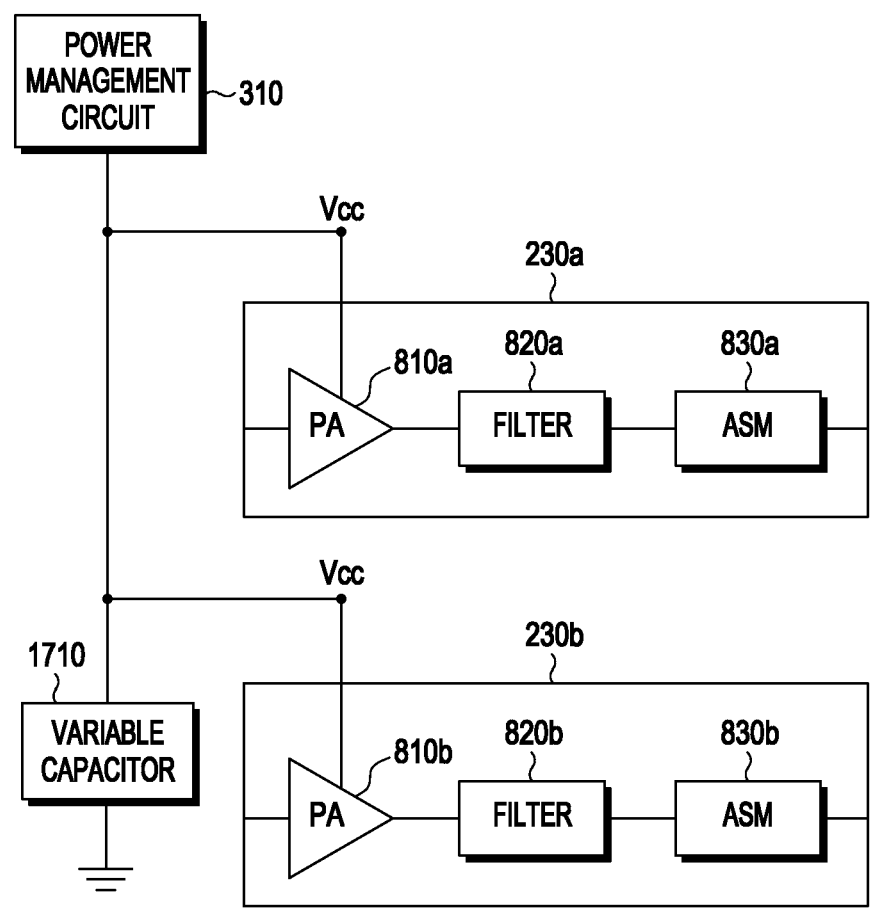
FIG. 17A is a block diagram illustrating an example configuration of the electronic device including multiple RFFEs according to various embodiments.

FIG. 17A is a block diagram illustrating an example configuration of the electronic device including multiple RFFEs according to various embodiments. Referring to FIG. 17A, the electronic device 101 may include the power management circuit 310 (e.g., power management IC (PMIC)), the first RFFE 230a, the second RFFE 230b, and a variable capacitor 1710. The first RFFE 230a may include a first power amplifier 810a, a first filter 820a, and a first antenna switch module (ASM) 830a, but is not limited thereto. The second RFFE 230b may include a second power amplifier 810b, a second filter 820b, and a second antenna switch module (ASM) 830b, but is not limited thereto. For example, the first RFFE 230a may correspond to the first RFFE 230a in one of FIG. 8A, FIG. 8B, and FIG. 8C, and the second RFFE 230b may correspond to the second RFFE 230b in one of FIG. 8A, FIG. 8B, and FIG. 8C. According to various embodiments, the first RFFE 230a may support one power amplification mode of the ET mode, the APT mode, and the APT/ET mode, and the second RFFE 230b may support one of the ET mode, the APT mode, and the APT/ET mode.

According to various embodiments, the variable capacitor 1710 may be connected in parallel between the power management circuit 310 and the second RFFE 230b. According to various embodiments, if the electronic device 101 transmits an RF signal by the first RFFE 230a, the power management circuit 310 may be controlled, based on the ET mode, to supply power to the first power amplifier 810a included in the first RFFE 230a so that the RF signal is not transmitted to the second RFFE 230b. When the first RFFE 230a operates based on the ET mode, the variable capacitor 1710 connected to the second RFFE 230b may be controlled to have capacitance of performance optimized for the ET mode according to a control signal transmitted from the CP 260 or the RFIC 220.

According to various embodiments, if the electronic device 101 transmits an RF signal by the second RFFE 230b, the power management circuit 310 may be controlled, based on the APT mode, to supply power to the second power amplifier 810b included in the second RFFE 230b so that the RF signal is not transmitted to the first RFFE 230a. According to various embodiments, when the second RFFE 230b operates based on the APT mode, the variable capacitor 1710 connected to the second RFFE 230b may be controlled to have capacitance of performance optimized for the APT mode according to a control signal transmitted from the CP 260 or the RFIC 220.

According to various embodiments, although FIG. 17A illustrates that two RFFEs 230a and 230b are connected in parallel to one power management circuit 310, three or more RFFEs may be connected according to various embodiments. According to various embodiments, the variable capacitor 1710 may be controlled to have optimal capacitance configured based on at least one of a frequency band, a frequency bandwidth, and a power amplification mode of an RF signal processed via the RFFEs 230a and 230b.

Figure 17B:
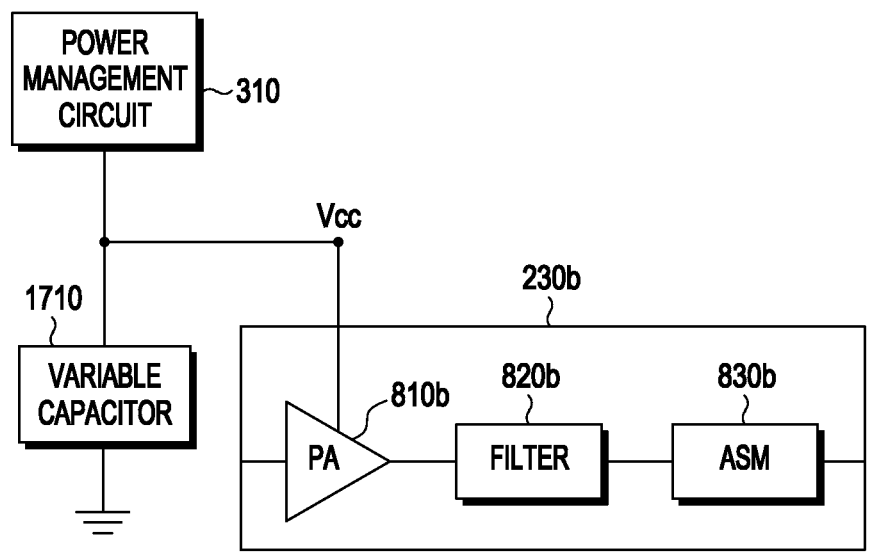
FIG. 17B is a block diagram illustrating an example configuration of the electronic device including a single RFFE according to various embodiments.

FIG. 17B is a block diagram illustrating an example configuration of the electronic device including a single RFFE according to various embodiments. Referring to FIG. 17B, although FIG. 17A illustrates that two RFFEs 230a and 230b are connected in parallel to one power management circuit 310, a single RFFE may be connected according to various embodiments. According to various embodiments, the variable capacitor 1710 may be controlled to have optimal capacitance configured based on at least one of a frequency band, a frequency bandwidth, and a power amplification mode of an RF signal processed via the RFFE 230b.

Figure 18:
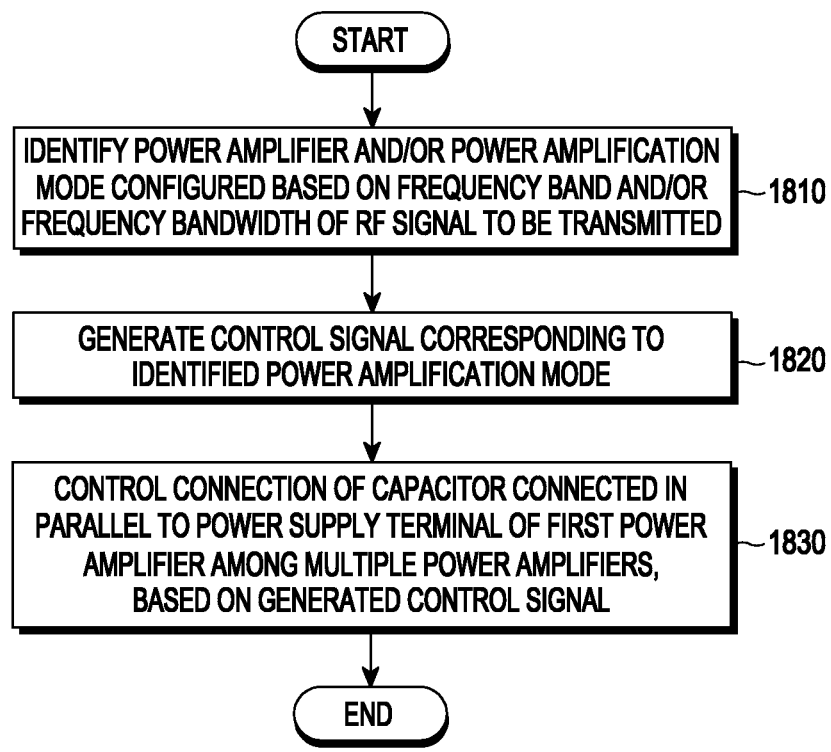
FIG. 18 is a flowchart illustrating an example operation of the electronic device according to various embodiments.

FIG. 18 is a flowchart illustrating an example operation of the electronic device according to various embodiments. Referring to FIG. 18, the electronic device 101 (e.g., the CP 260) may identify a power amplifier (e.g., the first power amplifier 810a or the second power amplifier 810b) and/or a power amplification mode configured based on a frequency band and/or a frequency bandwidth of an RF signal to be transmitted, in operation 1810.

For example, the electronic device 101 may transmit information (e.g., a measurement report) related to the strength (e.g., reference signal received power (RSRP)) of a reception signal to a base station. The base station may transmit, to the electronic device 101, an RRC reconfiguration message including a cell ID to be used by the electronic device 101, based on the measurement result. The CP 260 of the electronic device 101 may identify a frequency band and/or a frequency bandwidth to be used, based on the message received from the base station. The CP 260 of the electronic device 101 may select an RFFE and/or power amplification mode (e.g., the ET mode and the APT mode) to be used, based on the identified frequency band and/or frequency bandwidth.

According to various embodiments, the electronic device 101 may determine the set power amplification mode based on output power (e.g., transmission power of an RF signal) of a power amplifier (e.g., the first power amplifier 810a or the second power amplifier 810b). For example, when the output power of the power amplifier is set to 18 to 23 dBm, the ET mode may be determined, and when the output power of the power amplifier is set to 10 to 18 dBm, the APT mode may be determined, and when the output power of the power amplifier is set to 10 dBm or less, the direct mode may be determined.

According to various embodiments, the electronic device 101 (e.g., the CP 260 or the RFIC 220) may generate a control signal corresponding to the identified power amplification mode, in operation 1820. For example, as described above, in operation 1830, the electronic device 101 may control connection of a capacitor so that each RFFE has an optimal capacitance according to the power amplification mode. For example, the electronic device 101 may control the connection of the capacitor connected in parallel to a power supply terminal of the first power amplifier among multiple power amplifiers, based on the generated control signal.

According to various embodiments, the electronic device 101 may control a switch connected to the capacitor to be turned on or off based on the control signal. According to various embodiments, the electronic device 101 may configure to have an optimal capacitance corresponding to each frequency band by controlling connection to at least one capacitor through the switch, based on the identified frequency band. For example, if a frequency band of an RF signal to be transmitted is B2, the electronic device 101 may control to have a capacitance of 100 pF, may control to have a capacitance of 200 pF in a case of B66, and may control to have a capacitance of 300 pF in a case of B41. According to various embodiments, if the identified frequency band is a frequency band using the APT mode as the power amplification mode, the electronic device 101 may be configured to have an optimal capacitance corresponding to each frequency band by controlling the connection to at least one capacitor through the switch connected to the capacitor. For example, if the frequency band of the RF signal to be transmitted is B2, the electronic device 101 may control the switch so as to have a capacitance of 100 pF, may adjust the switch so as to have a capacitance of 200 pF in the case of B66, and may adjust the switch so as to have a capacitance of 300 pF in the case of B41. According to various embodiments, if the identified frequency band is a frequency band that does not use the APT mode as the power transmission mode (e.g., in a case of a frequency band using the ET mode), the electronic device 101 may control the switch connected to the capacitor to be turned off so as to have an optimal capacitance for the ET mode. According to various embodiments, if the switch is included within the RFFE 1100 as illustrated in FIG. 11, the switch may be controlled by a control signal provided through the MIPI bus line 1101 connected to the RFIC 220, as described above. According to various embodiments, if the switch is disposed outside the RFFE 1100 as illustrated in FIG. 12 or FIG. 13, the switch may be controlled by a control signal provided through the GPIO line 1201 or 1301 connected to the RFIC 220 or the CP 260, as described above.

According to various embodiments, operations 1810 to 1830 may be performed periodically or may be performed periodically every time when a frequency band and/or a frequency bandwidth is changed.

Figure 19:
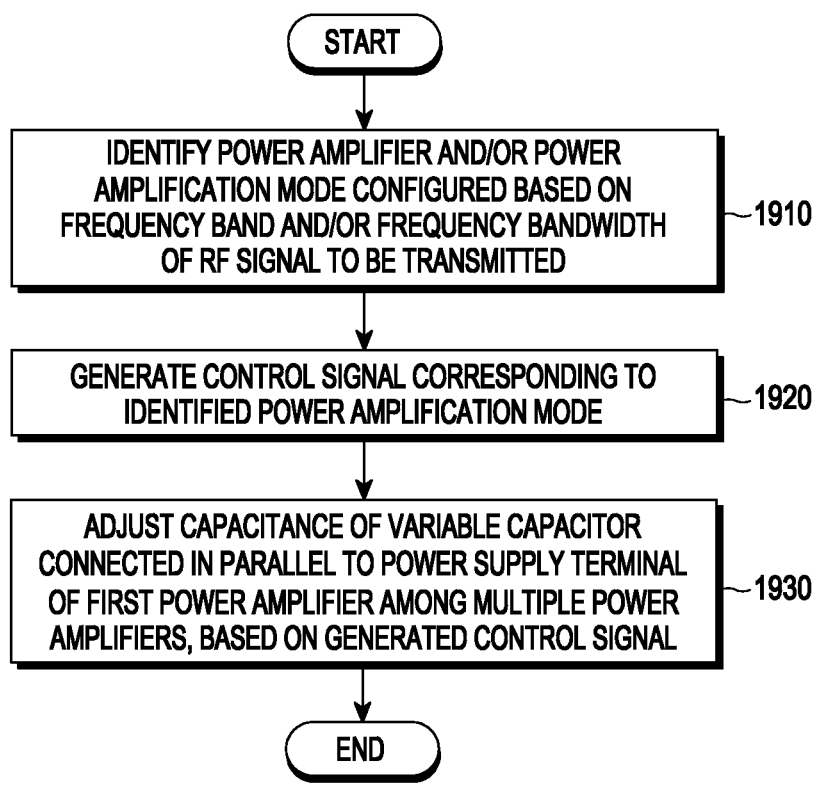
FIG. 19 is a flowchart illustrating an example operation of the electronic device according to various embodiments.

FIG. 19 is a flowchart illustrating an example operation of the electronic device according to various embodiments. Referring to FIG. 19, the electronic device 101 (e.g., the CP 260) may identify a power amplifier (e.g., the first power amplifier 810a or the second power amplifier 810b) and/or a power amplification mode configured based on a frequency band and/or a frequency bandwidth of an RF signal to be transmitted, in operation 1910.

For example, the electronic device 101 may transmit information (e.g., a measurement report) related to the strength (e.g., reference signal received power (RSRP)) of a reception signal to a base station. The base station may transmit, to the electronic device 101, an RRC reconfiguration message including a cell ID to be used by the electronic device 101, based on the measurement result. The CP 260 of the electronic device 101 may identify a frequency band and/or a frequency bandwidth to be used, based on the message received from the base station. The CP 260 of the electronic device 101 may select an RFFE and/or power amplification mode (e.g., the ET mode and the APT mode) to be used, based on the identified frequency band and/or frequency bandwidth.

According to various embodiments, the electronic device 101 may determine the set power amplification mode based on output power (e.g., transmission power of an RF signal) of a power amplifier (e.g., the first power amplifier 810a or the second power amplifier 810b). For example, when the output power of the power amplifier is set to 18 to 23 dBm, the ET mode may be determined, and when the output power of the power amplifier is set to 10 to 18 dBm, the APT mode may be determined, and when the output power of the power amplifier is set to 10 dBm or less, the direct mode may be determined.

According to various embodiments, the electronic device 101 (e.g., the CP 260 or the RFIC 220) may generate a control signal corresponding to the identified power amplification mode, in operation 1920. For example, as described above, in operation 1930, the electronic device 101 may adjust capacitance of a variable capacitor so that each RFFE has an optimal capacitance according to the power amplification mode. For example, the electronic device 101 may adjust the capacitance of the variable capacitor connected in parallel to a power supply terminal of the power amplifier, based on a generated control signal.

According to various embodiments, the electronic device 101 may be configured to have an optimal capacitance corresponding to each frequency band by adjusting the capacitance of the variable capacitor, based on the identified frequency band. For example, if the frequency band of an RF signal to be transmitted is B2, the electronic device 101 may adjust capacitance of the variable capacitor so as to have a capacitance of 100 pF, may adjust the capacitance of the variable capacitor so as to have a capacitance of 200 pF in the case of B66, and may adjust the capacitance of the variable capacitor so as to have a capacitance of 300 pF in the case of B41. According to various embodiments, if the identified frequency band is a frequency band using the APT mode as the power amplification mode, the electronic device 101 may be configured to have an optimal capacitance corresponding to each frequency band by adjusting the capacitance of the variable capacitor. For example, if the frequency band of the RF signal to be transmitted is B2, the electronic device 101 may adjust the capacitance of the variable capacitor so as to have a capacitance of 100 pF, may adjust the capacitance of the variable capacitor so as to have a capacitance of 200 pF in the case of B66, and may adjust the capacitance of the variable capacitor so as to have a capacitance of 300 pF in the case of B41. According to various embodiments, if the identified frequency band is a frequency band that does not use the APT mode as the power transmission mode (e.g., in a case of a frequency band using the ET mode), the electronic device 101 may adjust the capacitance of the variable capacitor or may control the switch connected to the variable capacitor to be turned off so as to have an optimal capacitance for the ET mode. According to various embodiments, if the switch is included within the RFFE 1100 as illustrated in FIG. 11, the capacitance of the variable capacitor may be adjusted by a control signal provided through the MIPI bus line 1101 connected to the RFIC 220, as described above. According to various embodiments, if the switch is disposed outside the RFFE 1100 as illustrated in FIG. 12 or FIG. 13, the capacitance of the variable capacitor may be controlled by a control signal provided through the GPIO line 1201 or 1301 connected to the RFIC 220 or the CP 260, as described above.

According to various embodiments, operations 1910 to 1930 may be performed periodically or may be performed periodically every time when a frequency band and/or a frequency bandwidth is changed.

Figure 20:
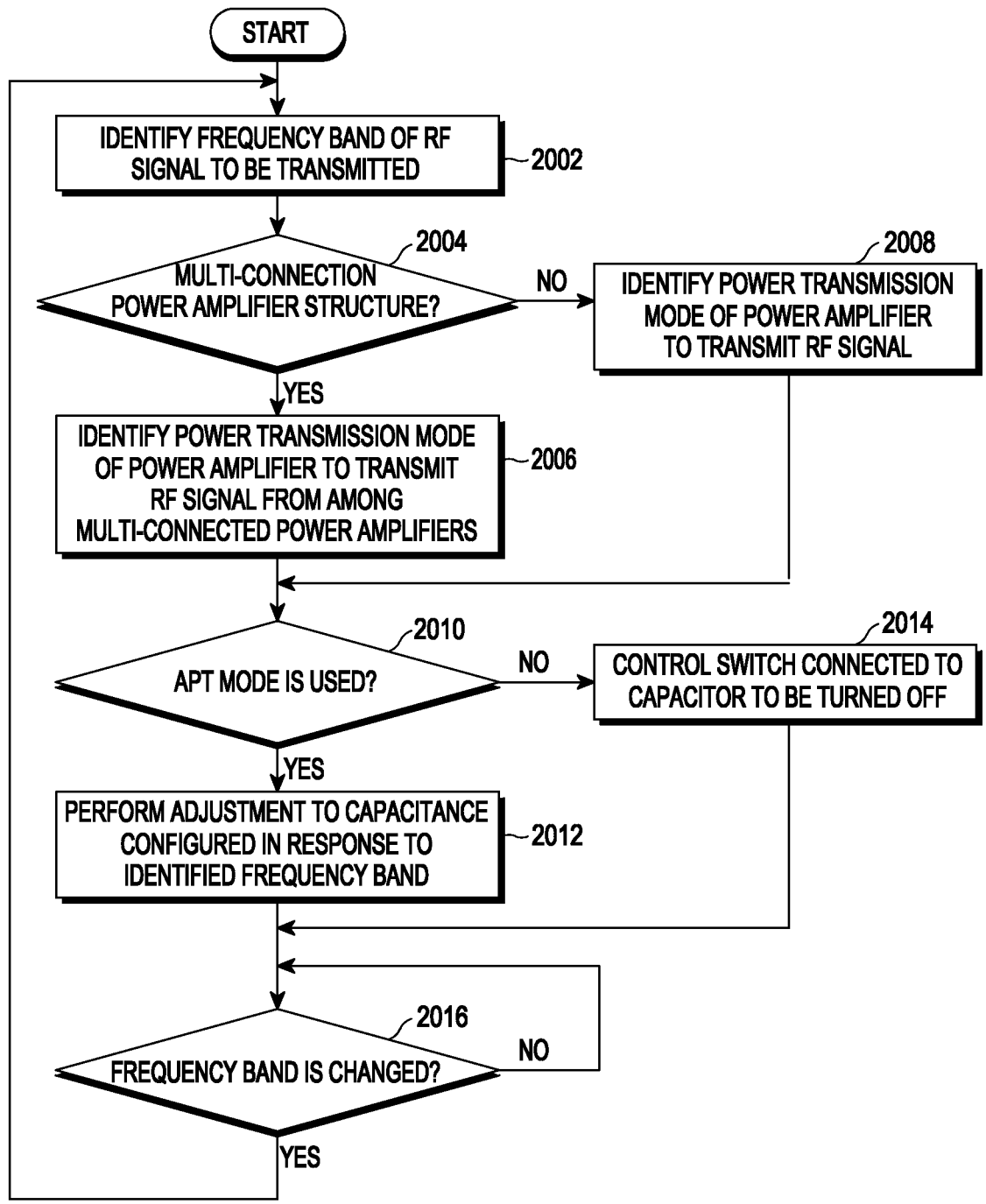
FIG. 20 is a flowchart illustrating an example operation of the electronic device according to various embodiments.

FIG. 20 is a flowchart illustrating an example operation of the electronic device according to various embodiments. Referring to FIG. 20, the electronic device 101 (e.g., the CP 260) may identify, in operation 2002, a frequency band and/or a frequency bandwidth of an RF signal to be transmitted.

According to various embodiments, in a case of a multi-connection power amplifier in operation 2004 (Yes in operation 2004), the electronic device 101 may identify a transmission mode of a power amplifier, in which an RF signal is to be transmitted, among multiple multi-connected power amplifiers, in operation 2006. In a case other than a multi-connection power amplifier in operation 2004 (No in operation 2004), the electronic device 101 may identify a power transmission mode of a corresponding power amplifier, in operation 2008.

According to various embodiments, if, as a result of identifying the power transmission mode, the APT mode is used (Yes in operation 2010), the electronic device 101 may perform, in operation 2012, adjustment to a capacitance configured in response to the frequency band identified in operation 2002. According to various embodiments, the electronic device 101 may control connection to at least one capacitance connected to an RFFE or may adjust a capacitance of a variable capacitor, so as to have a capacitance optimal for a corresponding frequency band. For example, if the frequency band of the RF signal to be transmitted is B2, the electronic device 101 may adjust the capacitance so as to have a capacitance of 100 pF, may adjust the capacitance so as to have a capacitance of 200 pF in the case of B66, and may adjust the capacitance so as to have a capacitance of 300 pF in the case of B41.

According to various embodiments, as a result of identifying the power transmission mode, if the APT mode is not used (No in operation 2010) (e.g., if the ET mode is used), the electronic device 101 may control a switch connected to the capacitor to be turned off in operation 2014, so as to have an optimal capacitance for the ET mode.

According to various embodiments, the electronic device 101 may determine in operation 2016 whether the frequency band is changed. As a result of the determination, if it is determined that the frequency band has been changed (Yes in operation 2016), the frequency band of the RF signal to be transmitted may be identified in operation 2002, and the aforementioned operation may be repeatedly performed. As a result of the determination, if it is determined that the frequency band has not been changed (No in operation 2016), the currently configured capacitance or switch state may be maintained.

As described above, according to various embodiments, by adjusting the capacitance to suit each power amplification mode in a structure in which multiple RFFEs 230 are connected to one power management circuit 310, optimal RF transmission performance for each power amplification mode (e.g., the ET mode or APT mode) may be provided as illustrated in <Table 5> below.

TABLE 5

| NSA mode | N41 100 MHz APT Mode Characteristics | |
|---|---|---|
| Channel | 528000 CH | |
| Presence or absence of power terminal Cap 2.2 uF | without Cap | with Cap |
| Power | 23.7 dBm | 23.7 dBm |
| ACLR | −33.7/−44.3 | −38.1/−45.1 |

Referring to <Table 5>, according to various embodiments, if capacitance is adjustable in the APT mode, it may be seen that performance of an adjacent channel leakage ratio (ACLR) is improved compared to a case where capacitance is unadjustable. For example, according to the measurement results in <Table 5>, in the APT mode, it may be identified that a left ACLR is measured to be −33.7 dB if the capacitance is unadjustable, and the left ACLR is measured to be −38.1 dB if the capacitance is adjustable. For example, according to various embodiments, if the capacitance is adjustable in the ATP mode, it can be seen that performance of the adjacent channel leakage ratio (ACLR) is improved by 4 dB or more at the same power (e.g., 23.7 dBm).

As described above, according to various embodiments, by adjusting capacitance to suit each power amplification mode in a structure in which multiple RFFEs 230 are connected to a single power management circuit 310, it is not required to dispose multiple power management circuits 310 corresponding to the multiple RFFEs 230, component costs may be reduced.

An electronic device according to various example embodiments may include: a communication processor, a radio frequency (RF) integrated circuit (RFIC) configured to receive a signal output from the communication processor and to modulate the signal into an RF signal, a power management circuit, a first power amplifier configured to amplify an RF signal output from the RFIC based on power supplied from the power management circuit, a second power amplifier configured to amplify the RF signal output from the RFIC based on the power supplied from the power management circuit, at least one capacitor connected in parallel to a power supply terminal of the first power amplifier, and at least one switch connected between the power supply terminal and the at least one capacitor, wherein the communication processor is configured to: identify a power amplification mode based a frequency band of the RF signal, and control the at least one switch by outputting a control signal corresponding to the identified power amplification mode.

According to various example embodiments, the communication processor may be configured to identify a power amplification mode further based on a frequency bandwidth of the RF signal.

According to various example embodiments, the communication processor may be configured to amplify the RF signal via a power amplifier selected from among the first power amplifier and the second power amplifier based on the frequency band of the RF signal.

According to various example embodiments, the power amplification mode may include an envelope tracking (ET) mode.

According to various example embodiments, the power amplification mode may include an average power tracking (APT) mode.

According to various example embodiments, the electronic device may include a plurality of capacitors connected in parallel to a power supply terminal of the first power amplifier, and the at least one switch may be connected to one of the plurality of capacitors based on the control signal.

According to various example embodiments, the at least one switch may be included in a first RF front-end (RFFB) circuit including the first power amplifier.

According to various example embodiments, the at least one switch may be disposed outside the first RF front-end (RFFB) circuit including the first power amplifier.

According to various example embodiments, the communication processor may be configured to: identify a configuration of a capacitor corresponding to the identified power amplification mode, and output a control signal corresponding to the configuration of the capacitor to control the at least one switch.

According to various example embodiments, the communication processor may be configured to transmit the control signal to the RFIC, and the RFIC may be configured to control the at least one switch based on the control signal.

According to various example embodiments, the RFIC may be configured to transmit the control signal to the at least one switch through a mobile industry processor interface (MIPI) bus line.

According to various example embodiments, the communication processor may be configured to transmit the control signal to the at least one switch through a general-purpose input and output (GPIO) line.

An electronic device according to various example embodiments may include: a communication processor, a radio frequency (RF) integrated circuit (RFIC) configured to receive a signal output from the communication processor and to modulate the signal into an RF signal, a power management circuit, a first power amplifier configured to amplify an RF signal output from the RFIC based on power supplied from the power management circuit, a second power amplifier configured to amplify the RF signal output from the RFIC based on the power supplied from the power management circuit, and a variable capacitor connected in parallel to a power supply terminal of the first power amplifier, wherein the communication processor is configured to: identify a power amplification mode based on a frequency band of the RF signal, and adjust capacitance of the variable capacitor by outputting a control signal corresponding to the identified power amplification mode.

According to various example embodiments, the communication processor may be configured to identify a power amplification mode further based on a frequency bandwidth of the RF signal.

According to various example embodiments, the communication processor may be configured to amplify the RF signal via a power amplifier selected from among the first power amplifier and the second power amplifier based on the frequency band of the RF signal.

According to various example embodiments, the power amplification mode may include an envelope tracking (ET) mode.

According to various example embodiments, the power amplification mode may include an average power tracking (APT) mode.

A front-end module according to various example embodiments may include: a power management circuit, a first power amplifier configured to amplify an RF signal output from an RFIC based on power supplied from the power management circuit, a second power amplifier configured to amplify the RF signal output from the RFIC based on the power supplied from the power management circuit, at least one capacitor connected in parallel to a power supply terminal of the first power amplifier, and at least one switch connected between the power supply terminal and the at least one capacitor, wherein the at least one switch is controlled by a control signal corresponding to a power amplification mode based on a frequency band of the RF signal.

According to various example embodiments, the power amplification mode may include an envelope tracking (ET) mode.

According to various example embodiments, the power amplification mode may include an average power tracking (APT) mode.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C", may include any one of, or all possible combinations of the items enumerated together in a corresponding one of the phrases. As used herein, such terms as "1st" and "2nd", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), the element may be coupled with the other element directly (e.g., wiredly), wirelessly, or via a third element.

As used in connection with various embodiments of the disclosure, the term "module" may include a unit implemented in hardware, software, or firmware, or any combination thereof, and may interchangeably be used with other terms, for example, "logic", "logic block", "part", or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components or operations may be omitted, or one or more other components or operations may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device comprising:
   a communication processor;
   a radio frequency (RF) integrated circuit (RFIC) configured to receive a signal output from the communication processor and to modulate the signal into an RF signal;
   a power management circuit;
   a first power amplifier configured to receive power supplied from the power management circuit;
   a second power amplifier connected in parallel to the first power amplifier and configured to receive the power supplied from the power management circuit;
   at least one capacitor connected in parallel to a power supply terminal of the first power amplifier; and
   at least one switch connected between the power supply terminal and the at least one capacitor,
   wherein the communication processor is configured to:
   identify a power amplification mode based on a frequency band of the RF signal,
   wherein the at least one switch is configured to control electrical connection or disconnection between the power supply terminal and the at least one capacitor based on the identified power amplification mode, and
   wherein based on the power amplification mode, the RF signal is amplified via either one of the first power amplifier or the second power amplifier.

2. The electronic device of claim 1, wherein the communication processor is configured to identify the power amplification mode further based on a frequency bandwidth of the RF signal.

3. The electronic device of claim 1, wherein the power amplification mode comprises an envelope tracking (ET) mode.

4. The electronic device of claim 1, wherein the power amplification mode comprises an average power tracking (APT) mode.

5. The electronic device of claim 1, wherein the electronic device comprises a plurality of capacitors connected in parallel to the power supply terminal of the first power amplifier, and
   the at least one switch is connected to one of the plurality of capacitors based on a control signal.

6. The electronic device of claim 1, wherein the at least one switch is included in a first RF front-end (RFFE) circuit including the first power amplifier.

7. The electronic device of claim 1, wherein the at least one switch is disposed outside a first RF front-end (RFFE) circuit including the first power amplifier.

8. The electronic device of claim 1, wherein the communication processor is configured to: identify a configuration of a capacitor corresponding to the identified power amplification mode, and
   output a control signal corresponding to the configuration of the capacitor to control the at least one switch.

9. The electronic device of claim 1, wherein the communication processor is configured to transmit a control signal to the RFIC, and
   the RFIC is configured to control the at least one switch based on the control signal.

10. The electronic device of claim 9, wherein the RFIC is configured to transmit the control signal to the at least one switch through a mobile industry processor interface (MIPI) bus line.

11. The electronic device of claim 1, wherein the communication processor is configured to transmit a control signal to the at least one switch through a general-purpose input and output (GPIO) line.

12. An electronic device comprising:
    a communication processor;
    a radio frequency (RF) integrated circuit (RFIC) configured to receive a signal output from the communication processor and to modulate the signal into an RF signal;
    a power management circuit;
    a first power amplifier configured to receive power supplied from the power management circuit;
    a second power amplifier connected in parallel to the first power amplifier and configured to receive the power supplied from the power management circuit; and
    a variable capacitor connected in parallel to a power supply terminal of the first power amplifier,
    wherein the communication processor is configured to:
    identify a power amplification mode based on a frequency band of the RF signal, and
    adjust capacitance of the variable capacitor by outputting a control signal corresponding to the identified power amplification mode,
    wherein based on the power amplification mode, the RF signal is amplified via either one of the first power amplifier or the second power amplifier.

13. The electronic device of claim 12, wherein the communication processor is configured to identify the power amplification mode further based on a frequency bandwidth of the RF signal.

14. The electronic device of claim 12, wherein the power amplification mode comprises an envelope tracking (ET) mode.

15. The electronic device of claim 12, wherein the power amplification mode comprises an average power tracking (APT) mode.

16. A front-end module include:
    a power management circuit,
    a first power amplifier configured to receive power supplied from the power management circuit,
    a second power amplifier connected in parallel to the first power amplifier configured to receive the power supplied from the power management circuit,
    at least one capacitor connected in parallel to a power supply terminal of the first power amplifier, and
    at least one switch connected between the power supply terminal and the at least one capacitor and configured to control electrical connection or disconnection between the power supply terminal and the at least one capacitor,
    wherein the at least one switch is controlled by a control signal corresponding to a power amplification mode based on a frequency band of a radio frequency (RF) signal, and
    wherein based on the power amplification mode, the RF signal is amplified via either one of the first power amplifier or the second power amplifier.

17. The front-end module of claim 16, wherein the power amplification mode comprises an envelope tracking (ET) mode.

18. The front-end module of claim 16, wherein the power amplification mode comprises an average power tracking (APT) mode.

\* \* \* \* \*